US008693222B2

(12) United States Patent
Yonezawa et al.

(10) Patent No.: US 8,693,222 B2
(45) Date of Patent: Apr. 8, 2014

(54) DC-DC CONVERTER, POWER SUPPLY UNIT AND AN INFORMATION PROCESSING APPARATUS

(75) Inventors: Yu Yonezawa, Kawasaki (JP);
Yoshiyasu Nakashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 76 days.

(21) Appl. No.: 13/306,367

(22) Filed: Nov. 29, 2011

(65) Prior Publication Data

US 2012/0182769 A1    Jul. 19, 2012

(30) Foreign Application Priority Data

Jan. 13, 2011  (JP) ................................. 2011-005331

(51) Int. Cl.
*H02H 7/125*  (2006.01)
(52) U.S. Cl.
USPC ..................................... 363/56.12; 363/21.12
(58) Field of Classification Search
USPC ............. 363/67, 69, 15, 16, 20, 21.01, 21.02, 363/21.12, 21.13, 21.16, 56.09, 56.11, 363/56.12, 131
See application file for complete search history.

(56) References Cited

U.S. PATENT DOCUMENTS

| | | | | |
|---|---|---|---|---|
| 5,828,559 A * | 10/1998 | Chen | ........................... | 363/56.05 |
| 6,005,779 A * | 12/1999 | Cohen | .............................. | 363/16 |
| 6,317,341 B1 * | 11/2001 | Fraidlin et al. | ............. | 363/56.09 |
| 6,798,672 B2 * | 9/2004 | Jinno | ............................... | 363/20 |
| 7,515,439 B2 * | 4/2009 | Leu | ................................. | 363/16 |
| 8,378,647 B2 * | 2/2013 | Yonezawa et al. | ............. | 323/222 |
| 2003/0142515 A1 * | 7/2003 | Kim et al. | ................... | 363/21.15 |
| 2005/0207180 A1 * | 9/2005 | Pansier | ........................... | 363/16 |
| 2007/0188957 A1 * | 8/2007 | Weng et al. | ................... | 361/91.7 |
| 2011/0101880 A1 * | 5/2011 | Ribarich | ........................ | 315/250 |
| 2012/0106220 A1 * | 5/2012 | Yamaguchi et al. | .......... | 363/131 |

FOREIGN PATENT DOCUMENTS

| | | | |
|---|---|---|---|
| JP | 2002-101657 | * | 4/2002 |
| JP | 2002-101657 A | | 4/2002 |
| JP | 2010-200512 A | | 9/2010 |

* cited by examiner

*Primary Examiner* — Adolf Berhane
*Assistant Examiner* — Kyle J Moody
(74) *Attorney, Agent, or Firm* — Fujitsu Patent Center

(57) ABSTRACT

A DC-DC converter includes a first winding of a first transformer to which direct current power is supplied, a switching element configured to be connected in series with the first winding of the first transformer, a first winding of a second transformer and a capacitor configured to be connected in series with each other and in parallel with the switching element, a second winding of the first transformer configured to be coupled with the first winding of the first transformer, output terminals configured to be connected to the second winding of the first transformer and to output direct current power, and a pair of second windings of the second transformer configured to be coupled with the first winding of the second transformer, the second windings of the second transformer being connected in parallel with each other with reverse polarity between the output terminals.

12 Claims, 15 Drawing Sheets

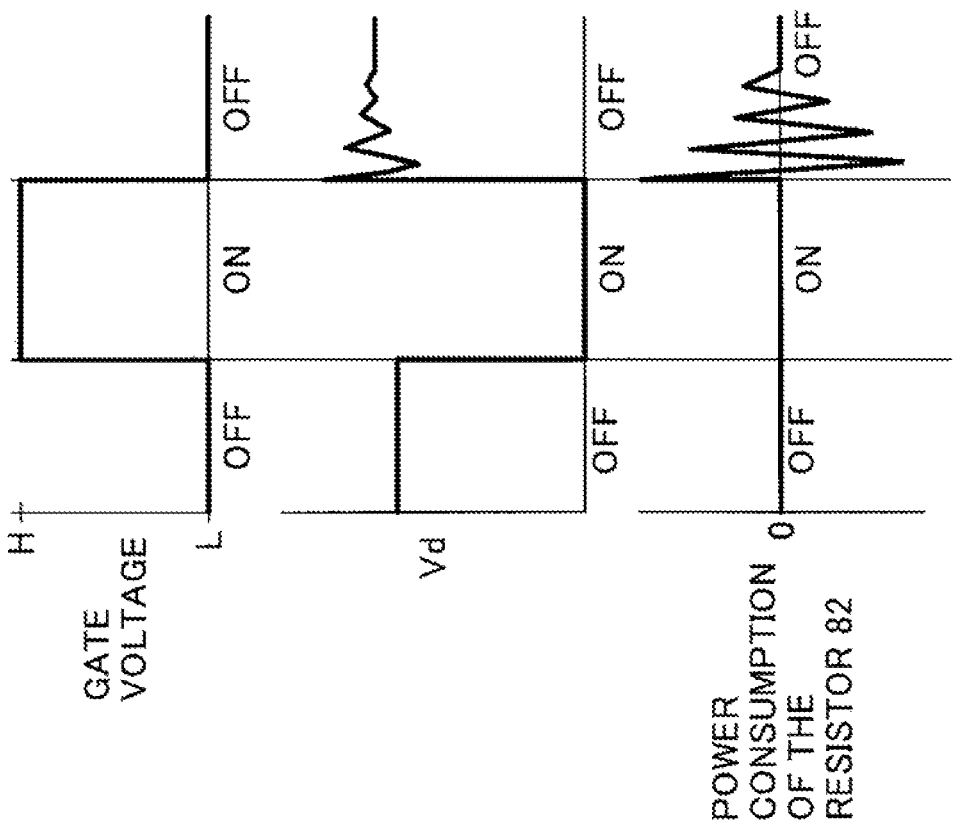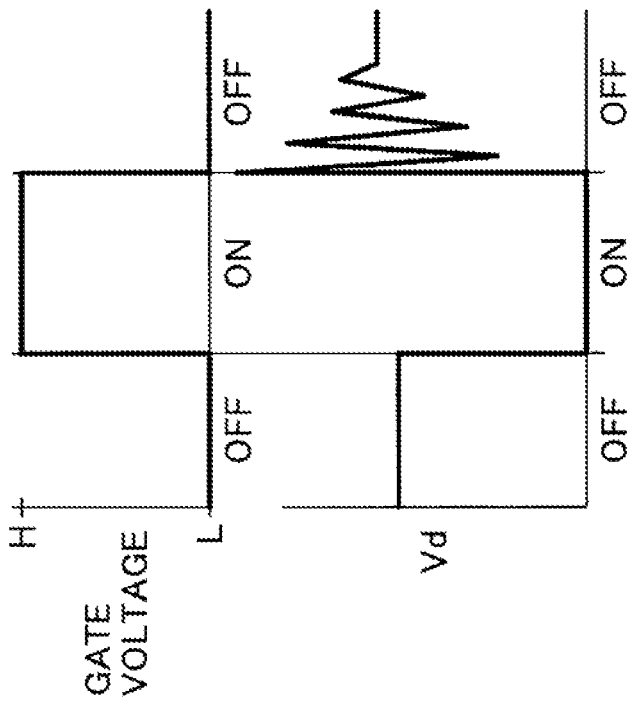

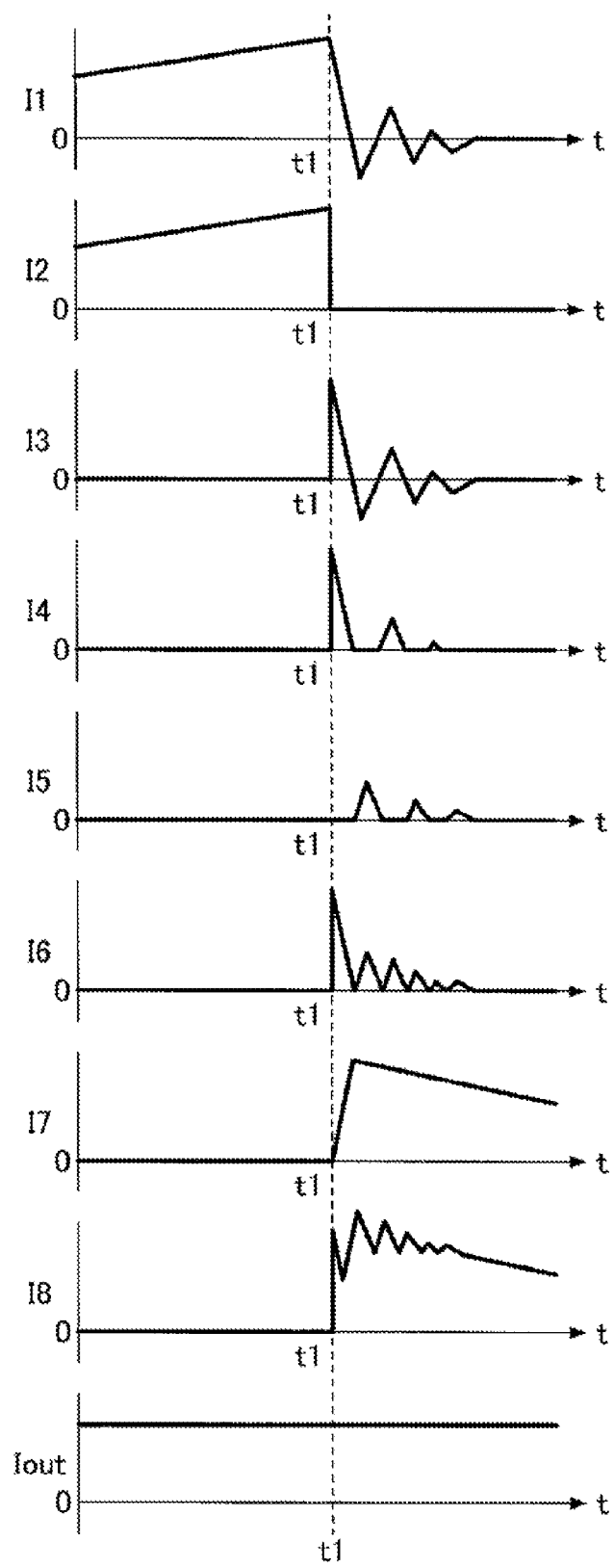

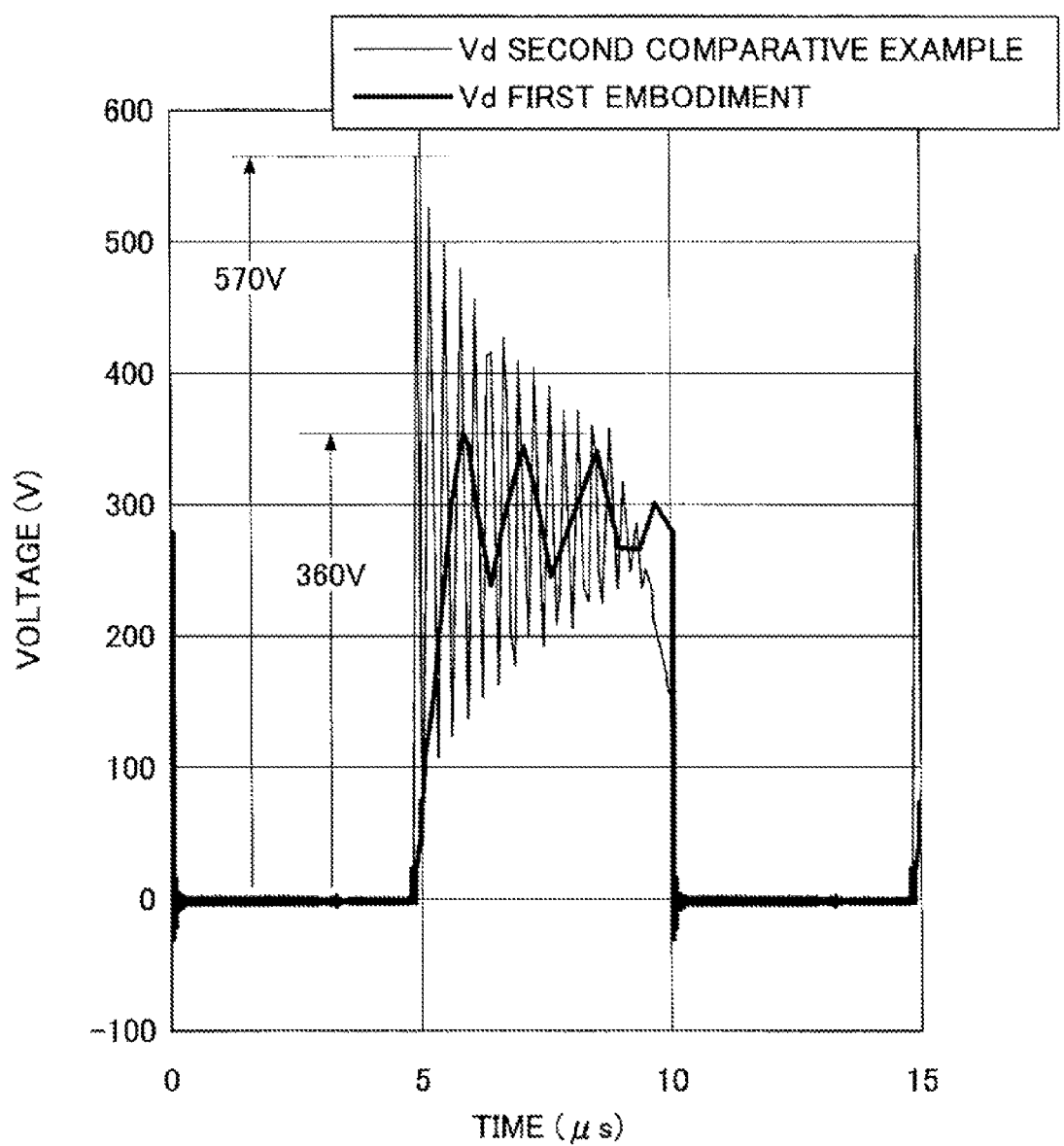

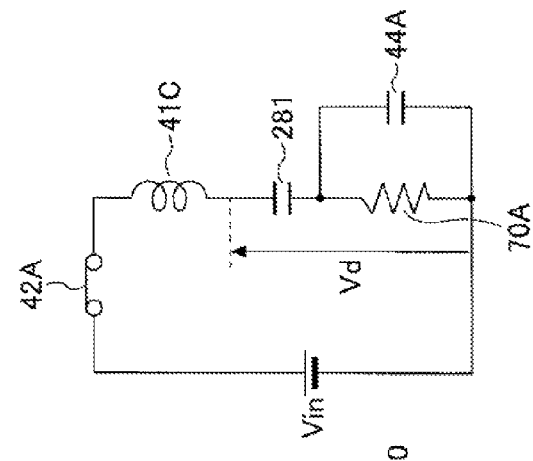
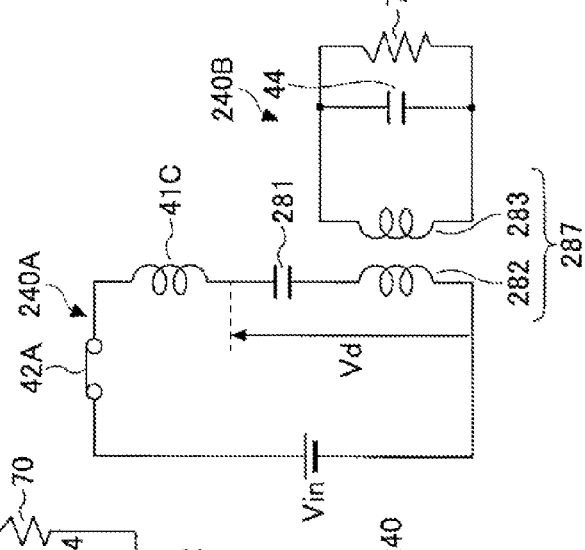
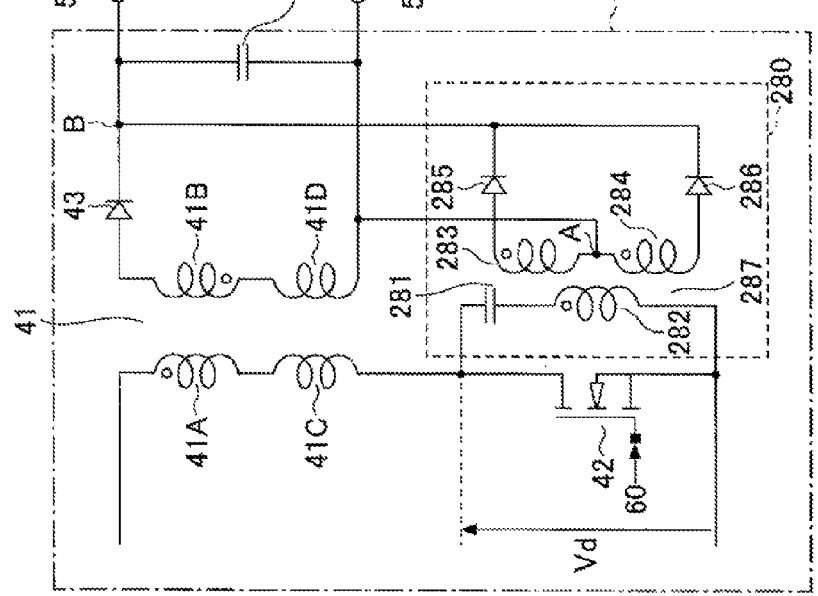

DC-DC CONVERTER, POWER SUPPLY UNIT AND AN INFORMATION PROCESSING APPARATUS

CROSS-REFERENCE TO RELATED APPLICATIONS

This patent application is based upon and claims the benefit of priority of the prior Japanese Patent Application No. 2011-005331 filed on Jan. 13, 2011, the entire contents of which are incorporated herein by reference.

FIELD

The embodiments discussed herein are related to a DC-DC converter, a power supply unit and an information processing apparatus.

BACKGROUND

There is a power supply unit known in the art. Such a power supply unit generally includes a snubber circuit and a diode. The snubber circuit includes a first winding of a regenerating transformer and a capacitor connected in series with the first winding. The diode feeds back an inductive voltage of a second winding of the regenerating transformer of the snubber circuit to a direct current power source.

There is another power supply unit known in the art. Such a power supply unit generally includes a winding which is coupled to a reactor of a snubber circuit, and a circuit which rectifies and smoothes an inductive voltage of the winding. Since the circuit feeds a part of energy which is collected in the snubber circuit to a load circuit, the power supply unit reduces a current which is flowing into a switching element.

According to the power supply unit which feeds back the inductive voltage of the second winding of the regenerating transformer of the snubber circuit to the direct current power source, power which is fed back to the direct current power source is resupplied to a secondary side circuit via a transformer. Accordingly, a part of the power which is fed back to the direct current power source is consumed in the transformer as surge energy. Thus, electrical consumption of the power supply unit is increased.

According to the power supply unit which includes the circuit that rectifies and smoothes the inductive voltage of the winding, only a positive component of the inductive voltage is supplied to the load circuit. Thus, a regeneration rate of the power supply unit is reduced.

PRIOR ART REFERENCES

Patent References

[Patent Reference 1] Japanese Laid-Open Patent Application No. 2010-200512
[Patent Reference 2] Japanese Laid-Open Patent Application No. 2002-101657

SUMMARY

According to an aspect of an embodiment, there is provided a DC-DC converter including: a first winding of a first transformer to which direct current power is supplied; a switching element configured to be connected in series with the first winding of the first transformer; a first winding of a second transformer and a capacitor configured to be connected in series with each other and to be connected in parallel with the switching element; a second winding of the first transformer configured to be coupled with the first winding of the first transformer; a pair of output terminals configured to be connected to the second winding of the first transformer and to output direct current power; and a pair of second windings of the second transformer configured to be coupled with the first winding of the second transformer, the second windings of the second transformer being connected in parallel with each other with reverse polarity between the output terminals.

In another aspect, there is provided a power supply unit including: input terminals to which alternating current power is supplied; a rectifier circuit configured to rectify the alternating current power supplied from the input terminals and output direct current power; a smoothing capacitor configured to smooth the direct current power rectified by the rectifier circuit; and a DC-DC converter including: a first winding of a first transformer to which the direct current power smoothed by the smoothing capacitor is supplied; a switching element configured to be connected in series with the first winding of the first transformer; a first winding of a second transformer and a capacitor configured to be connected in series with each other and to be connected in parallel with the switching element; a second winding of the first transformer configured to be coupled with the first winding of the first transformer; a pair of output terminals configured to be connected to the second winding of the first transformer and to output a direct current power; and a pair of second windings of the second transformer configured to be coupled with the first winding of the second transformer, the second windings of the second transformer being connected in parallel with each other with reverse polarity between the output terminals.

In another aspect, there is provided an information processing apparatus including: a power supply unit including: input terminals to which alternating current power is supplied; a rectifier circuit configured to rectify the alternating current power supplied from the input terminals and output direct current power; a smoothing capacitor configured to smooth the direct current power rectified by the rectifier circuit; and a DC-DC converter including: a first winding of a first transformer to which the direct current power smoothed by the smoothing capacitor is supplied; a switching element configured to be connected in series with the first winding of the first transformer; a first winding of a second transformer and a capacitor configured to be connected in series with each other and to be connected in parallel with the switching element; a second winding of the first transformer configured to be coupled with the first winding of the first transformer; a pair of output terminals configured to be connected to the second winding of the first transformer and to output a direct current power; and a pair of second windings of the second transformer configured to be coupled with the first winding of the second transformer, and to be connected in parallel with each other with reverse polarity between the output terminals; a processor; and a storage unit, wherein the processor and the storage unit are supplied with power via the power supply unit.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

BRIEF DESCRIPTION OF THE DRAWINGS

FIG. 6A is a graph illustrating the gate voltage and the drain voltage of the switching element 42 of the DC-DC converter according to the first comparative example;

FIG. 6B is a graph illustrating a gate voltage and a drain voltage of a switching element of a DC-DC converter according to the second comparative example and power consumption of a resistor;

FIG. 10 is a graph illustrating currents that flow through the DC-DC converter;

FIG. 11 is a characteristic graph illustrating simulation results of a surge voltage obtained in the DC-DC converter according to the first embodiment and the DC-DC converter according to the second comparative example;

FIG. 12A is a circuit diagram illustrating the DC-DC converter according to the first embodiment;

FIG. 12B is a circuit diagram illustrating an equivalent circuit of the DC-DC converter according to the first embodiment;

FIG. 12C is a circuit diagram illustrating an equivalent circuit of the DC-DC converter according to the first embodiment;

DESCRIPTION OF EMBODIMENTS

A description is given, with reference to the accompanying drawings, of embodiments of a direct current-direct current converter (DC-DC converter), a power supply unit and an information processing apparatus.

Prior to illustration of the embodiments of the DC-DC converter, the power supply unit and the information processing apparatus, first and second comparative examples of power supply units are described with reference to FIGS. 1 to 6.

Figure 1:
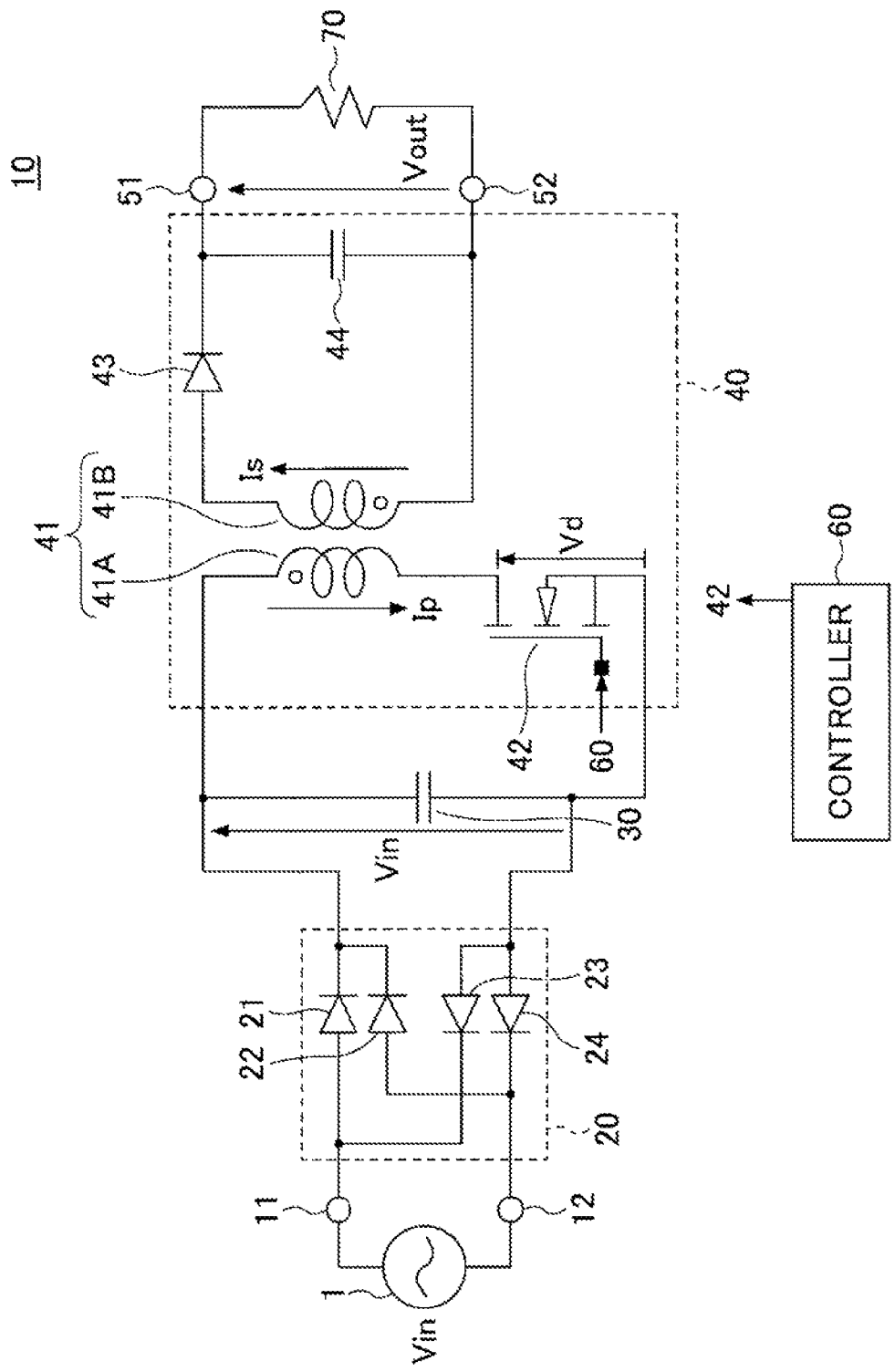
FIG. 1 is a diagram illustrating a first comparative example of a power supply unit.

FIG. 1 is a diagram illustrating the first comparative example of the power supply unit.

The first comparative example of the power supply unit 10 includes input terminals 11 and 12, a rectifier circuit 20, a first smoothing capacitor 30, a DC-DC converter 40, output terminals 51 and 52, and a controller 60.

In the first comparative example of the power supply unit 10, the input terminals 11 and 12 are connected with an input side of the rectifier circuit 20, and an alternating current power source (AC power source) 1 is connected between the input terminals 11 and 12. An AC power which is output from the AC power source 1 is input to the rectifier circuit 20 via the input terminals 11 and 12.

The rectifier circuit 20 is a diode bridge circuit that is formed of four diodes 21, 22, 23 and 24 in a bridge circuit configuration. The rectifier circuit 20 is connected to the AC power source 1 via the input terminals 11 and 12, and provides full-wave rectification. The rectifier circuit 20 converts the AC power input from the AC power source 1 into DC power.

Since an output voltage (effective value) of the AC power source 1 is Vin, an input voltage of the rectifier circuit 20 becomes Vin. The rectifier circuit 20 provides the full-wave rectification to the AC power which is input from the AC power source 1 and outputs the DC power.

Since a voltage of the AC power input from the AC power source 1 ranges from 80 V to 265 V, for example, voltage drop in the diodes 21, 22, 23 and 24 of the rectifier circuit 20 may be omitted.

Hereinafter, an output voltage of the rectifier circuit 20 is referred to as Vin which is equal to the input voltage of the rectifier circuit 20.

The first smoothing capacitor 30 smoothes DC voltage which is output from the rectifier circuit 20 and inputs the DC voltage to the DC-DC converter 40. Input voltage of the DC-DC converter 40 is 100 V, for example.

The DC-DC converter 40 converts voltage of the DC power, and includes a transformer 41, a switching element 42, a diode 43 and a second smoothing capacitor 44. The DC-DC converter 40 constitutes a DC-DC converter of the first comparative example.

The transformer 41 is a flyback type transformer, and includes a first winding 41A and a second winding 41B.

The first winding 41A of the transformer 41 is connected to the switching element 42 in series. The first winding 41A and the switching element 42 are connected parallel to the first smoothing capacitor 30.

The second winding 41B is connected to the diode 43 in series. The second winding 41B and the diode 43 are connected parallel to the second smoothing capacitor 44.

Arrows Ip and Is illustrated in FIG. 1 indicate positive directions of a current Ip which flows through the first winding 41A and a current Is which flows through the second winding 41B, respectively.

The switching element 42 may preferably be formed of a metal oxide semiconductor field-effect transistor (MOSFET). When the controller 60 applies a pulse voltage to a ate of the switching element 42, the switching element 42 is turned on or off.

A drain of the switching element 42 is connected to the first winding 41A, and a source of the switching element 42 is connected to a low potential side terminal of the first smoothing capacitor 30. The low potential side terminal is connected to a lower electrode of the first smoothing capacitor 30 illustrated as FIG. 1. Hereinafter, a drain voltage of the switching element 42 is referred to as Vd.

The diode 43 is a rectifier element which conducts in the direction from the second winding 41B toward the output terminal 51. The diode 43 may preferably be formed of a fast recovery diode or a SiC (Silicon Carbide) Schottky diode, for example.

The second smoothing capacitor 44 is connected between the output terminals 51 and 52, and is connected parallel to the second winding 41B and the diode 43. The second smoothing capacitor 44 smoothes the power output from the diode 43.

A load circuit 70 is connected between the output terminals 51 and 52. The load circuit 70 may be a CPU (Central Processing Unit), a main memory, an auxiliary memory or the like, in a case where an information processing apparatus including the power supply unit 10 illustrated as FIG. 1 is PC (Personal Computer), for example.

Hereinafter, the voltage between the output terminals 51 and 52 is referred to as an output voltage Vout of the power supply unit 10 or the DC-DC converter 40.

The DC-DC converter 40 converts 100 V of the DC power into 12 V, for example, and outputs the output voltage Vout to the load circuit 70 via the output terminals 51 and 52.

In a primary side of the power supply unit 10 illustrated as FIG. 1, the input terminal 12, the low potential side terminal of the first smoothing capacitor 30 and the source of the switching element 42 are kept 0 V.

In a secondary side of the power supply unit 10 illustrated as FIG. 1, a low potential side terminal of the second smoothing capacitor 44 and the output terminal 52 are kept 0 V.

Next, the switching of the switching element 42, the current Ip flowing through the first winding 41A, the current Is flowing through the second winding 41B, the drain voltage Vd of the switching element 42 and output voltage Vout of the power supply unit 10 according to the first comparative example are described with reference to FIG. 2.

Figure 2:
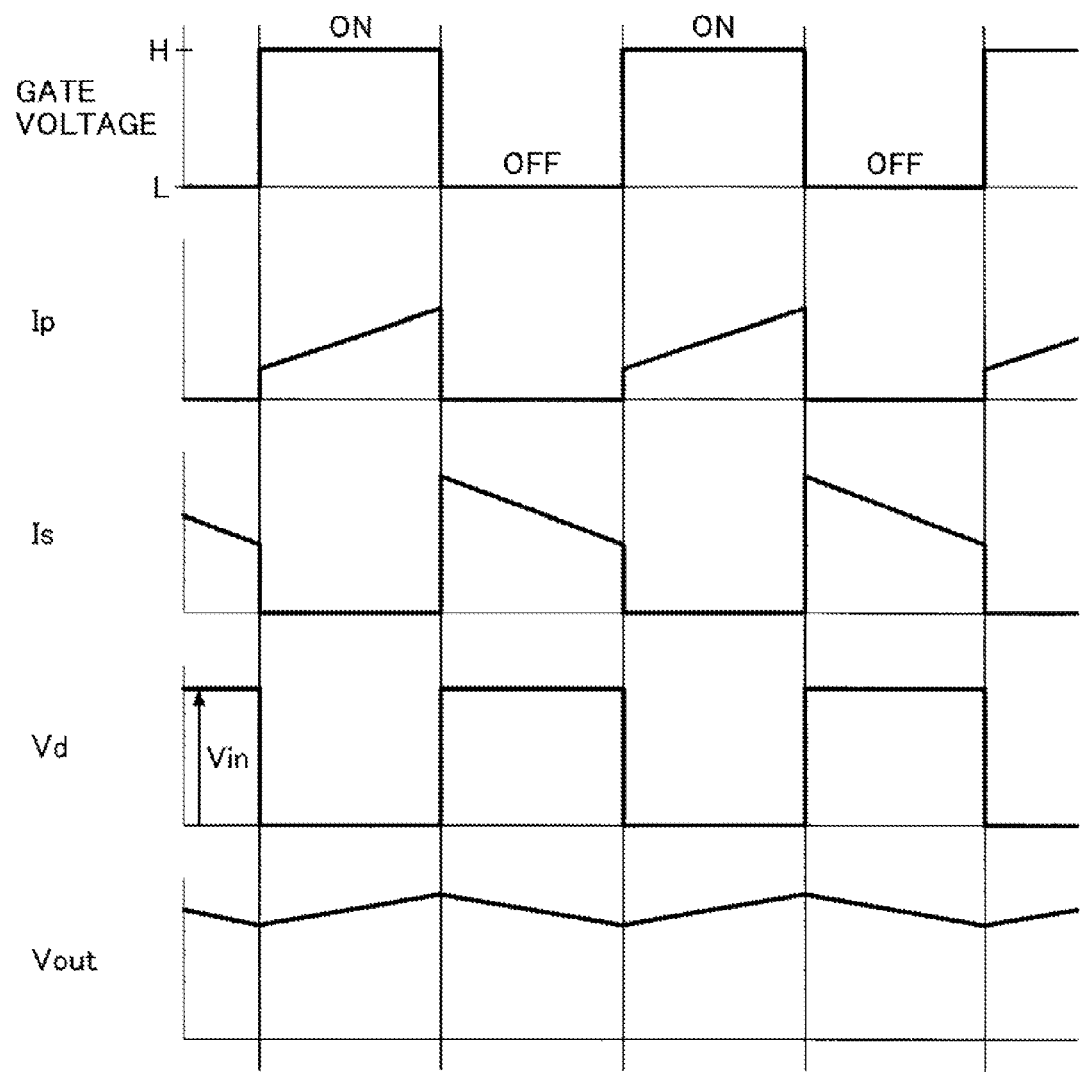
FIG. 2 is a graph illustrating a gate voltage of a switching element, a current Ip flowing through a first winding, a current Is flowing through a second winding, a drain voltage Vd of the switching element and an output voltage Vout of a power supply unit according to a first comparative example.

FIG. 2 is a graph illustrating the gate voltage of the switching element 42, the current Ip flowing through the first winding 41A, the current Is flowing through the second winding 41B, the drain voltage Vd of the switching element 42 and output voltage Vout of the power supply unit 10 according to the first comparative example. The gate voltage (H (High)/L (Low)) indicates switching on/off of the switching element 42.

The controller 60 applies a pulse voltage at a designated frequency to the gate of the switching element 42. As illustrated in FIG. 2, the current Ip flows through the first winding 41A when the switching element 42 is turned on, and the current Ip does not flow through the first winding 41A when the switching element 42 is turned off.

Therefore, as illustrated in FIG. 2, the current Ip flowing through the first winding 41A gradually increases when the switching element 42 is turned on, and becomes zero when the switching element 42 is turned off.

Herein, the transformer 41 which includes the first winding 41A and the second winding 41B is the flyback type transformer. Thus, the diode 43 is connected to the second winding 41B so that the current Is flows in the positive direction.

Therefore, the current Is flowing through the second winding 41B becomes zero, i.e. the current Is does not flow through the second winding 41B when the switching element 42 is turned on. The current Is flowing through the winding 41B gradually decreases when the switching element 42 is turned off.

Accordingly, the current Is does not flow through the second winding 41B, and magnetic energy is collected in the second winding 41B when the switching element 42 is turned on. When the switching element 42 is turned off, the magnetic energy is released from the winding 41B as the current Is. Thus, the current Is flows through the second winding 41B when the switching element 42 is turned off.

As illustrated in FIG. 2, the drain voltage of the switching element 42 becomes zero when the switching element 42 is turned on, and the drain voltage becomes Vin when the switching element 42 is turned off.

The output voltage Vout which is output from the output terminals 51 and 52 decreases when the current Is flowing through the second winding 41B decreases. The output voltage Vout increases when the current Is does not flow through the second winding 41B. However, a fluctuation of the output voltage Vout is minutely small.

Next, the surge voltage which is generated in the DC-DC converter 40 is described with reference to FIG. 3.

Figure 3:
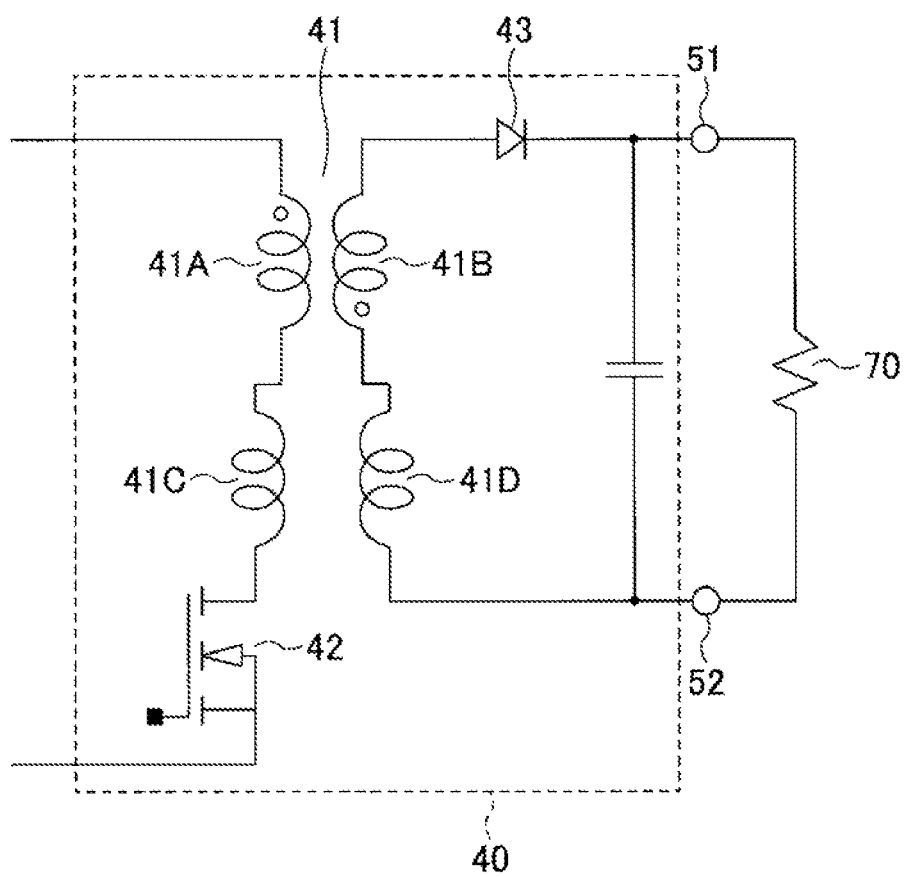
FIG. 3 is a diagram illustrating a DC-DC converter according to the first comparative example.

FIG. 3 is a diagram illustrating the DC-DC converter 40 according to the first comparative example.

The DC-DC converter 40 according to the first comparative example includes the transformer 41. Since a coupling of the first winding 41A and the second winding 41B of the transformer 41 is not perfect, the transformer 41 includes a leakage inductance.

Herein, for purposes of illustration, the transformer 41 is described as to include a leakage inductor which has the leakage inductance. The leakage inductance is a part of the inductance of the transformer 41.

Accordingly, hereinafter, the transformer 41 is described as to include a first leakage inductor 41C and a second leakage inductor 41D in addition to the first winding 41A and the second winding 41B.

When the transformer 41 transforms the power from the primary side to the secondary side, magnetic energy is collected in the first leakage inductor 41C. When the switching element 42 is turned off, the energy is released as surge energy. The surge energy appears as the surge voltage in the switching element 42.

Figure 4A:
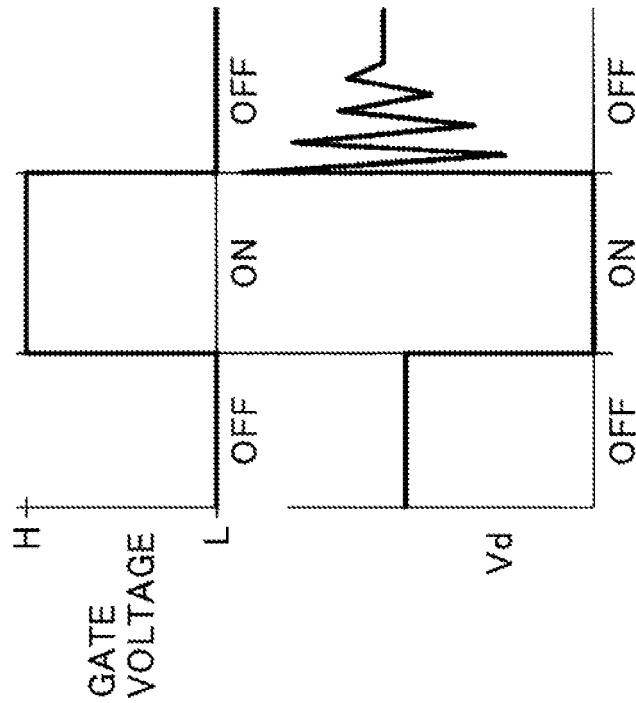
FIG. 4A is a graph illustrating the gate voltage and the drain voltage of the switching element of the DC-DC converter according to the first comparative example.
Figure 4B:
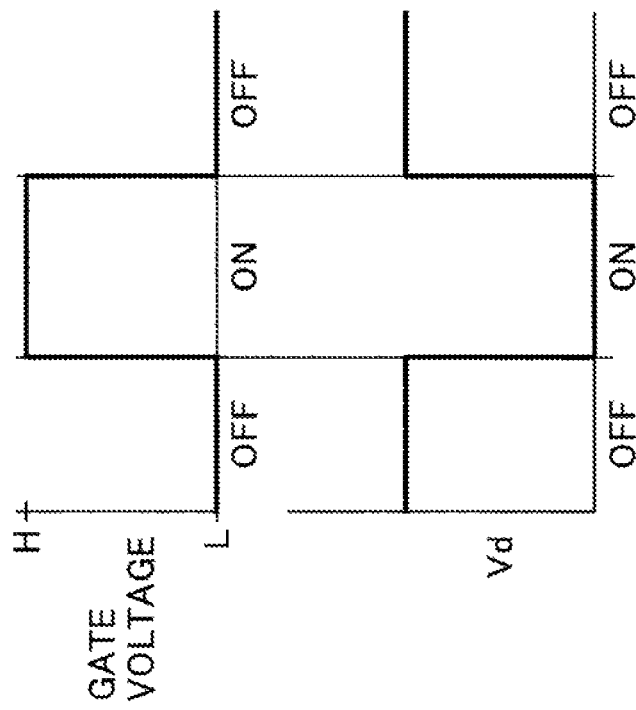
FIG. 4B is a graph illustrating the gate voltage and the drain voltage of the switching element of the DC-DC converter according to the first comparative example.

FIGS. 4A and 4B are graphs illustrating the gate voltage and the drain voltage Vd of the switching element 42 of the DC-DC converter 40 according to the first comparative example. FIG. 4A illustrates a relationship between the gate voltage and the drain voltage Vd of the switching element 42 connected to the ideal transformer 41 which does not include the leakage inductor. FIG. 4B illustrates a relationship between the gate voltage and the drain voltage Vd of the switching element 42 connected to the real transformer 41 which includes the leakage inductor.

In FIGS. 4A and 4B, "ON" and "OFF" indicate on and off of the switching element 42.

As illustrated in FIG. 4A, according to the ideal transformer 41 which does not include the leakage inductor, the surge voltage is not generated and the drain voltage Vd varies in a pulse manner when the switching element 42 is switched by switching the gate voltage of the switching element 42.

On the contrary, as illustrated in FIG. 4B, according to the real transformer 41 which includes the leakage inductor, the surge voltage is generated in the drain voltage Vd when the switching element 42 is turned off by turning off the switching element 42 by applying the gate voltage of 0 V.

The magnetic energy is collected in the leakage inductor 41C when the switching element 42 is turned on and is released from the leakage inductor 41C as the surge energy when the switching element 42 is turned off. The surge voltage is generated by the surge energy released from the switching element 42.

The surge voltage may appear as noise in the output voltage of the power supply unit 10 and the switching element 42 may be damaged. Thus, it is preferable to suppress the surge voltage.

Further, the surge voltage may increase up to more than two times as high as an input voltage of the switching element 42.

Thus, according to the first comparative example, it is preferable to set a withstand voltage of the switching element 42 more than two times of the input voltage of the switching element 42 so that the switching element 42 can withstand the surge voltage.

Since an on resistance of a switching element which has a high withstand voltage is relatively high, power loss of the DC-DC converter 40 may be increased, i.e. circuit efficiency may be decreased.

Since the switching element which has the high withstand voltage is more expensive than a switching element which has a low withstand voltage, costs of the DC-DC converter 40 and the power supply unit 10 may be increased.

Next, a power supply unit 10A according to the second comparative example is described with reference to FIG. 5.

Figure 5:
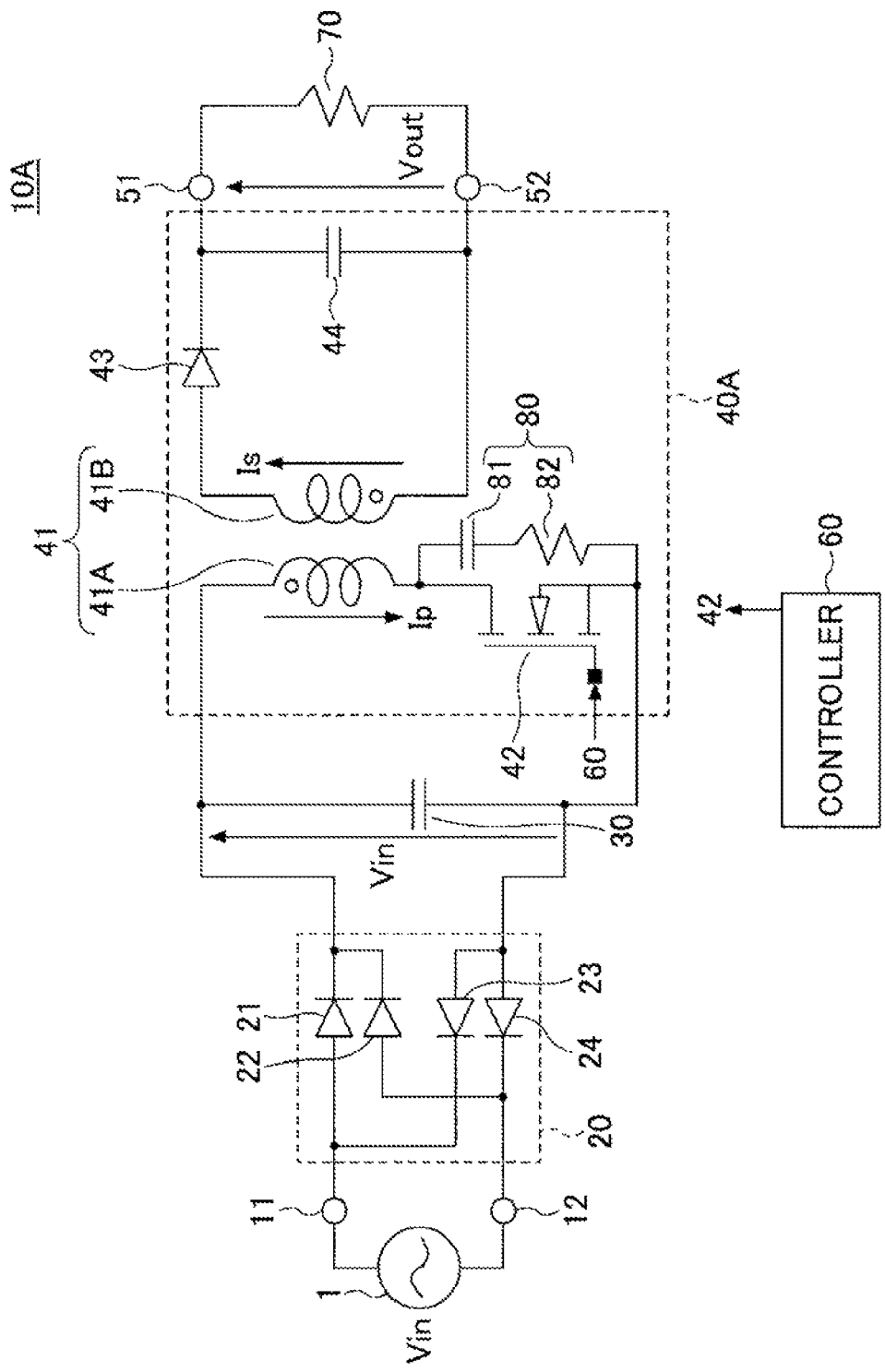
FIG. 5 is a diagram illustrating a second comparative example of a power supply unit.

FIG. 5 is a diagram illustrating the second comparative example of the power supply unit 10A.

The power supply unit 10A according to the second comparative example is different from the power supply unit 10 according to the first comparative example in that the power supply unit 10A includes a DC-DC converter 40A. The DC-DC converter 40A according to the second comparative example is different from the DC-DC converter 40 in that the DC-DC converter 40A includes a snubber circuit 80. The components included in the power supply unit 10A other than the snubber circuit 80 are similar to the components included in the power supply unit 10. Thus, the same reference numerals are assigned to components identical to those of the first comparative example of the power supply unit 10 (see FIG. 1), and the corresponding descriptions are appropriately omitted.

The DC-DC converter 40A according to the second comparative example includes the snubber circuit 80 which is connected in parallel between the drain and the source of the switching element 42. The snubber circuit 80 includes a capacitor 81 and a resistor 82. The capacitor 81 and the resistor 82 are connected in series.

The capacitor 81 of the snubber circuit 80 forms a resonant circuit with the leakage inductor 41C. When the switching element 42 is turned off and the surge voltage and is generated, the surge voltage is absorbed in the capacitor 81 and then the surge energy (surge power) is consumed at the resistor 82, i.e. the snubber circuit 80 absorbs the surge energy.

FIG. 6A is a graph illustrating the gate voltage and the drain voltage Vd of the switching element 42 of the DC-DC converter 40 according to the first comparative example. FIG. 6B is a graph illustrating the gate voltage and the drain voltage Vd of the switching element 42 of the DC-DC converter 40A according to the second comparative example and power consumption of the resistor 82.

In FIGS. 6A and 6B, "ON" and "OFF" indicate on and off of the switching elements 42 included in the DC-DC converters 40 and 40A.

The gate voltage and the drain voltage as illustrated in FIG. 6A are the same with those as illustrated in FIG. 4B. Thus, as illustrated in FIG. 6A, according to the first comparative example, the surge voltage is generated when the switching element 42 is turned off.

On the contrary, as illustrated in FIG. 6B, according to the second comparative example, since the snubber circuit 80 absorbs the surge energy, the surge voltage included in the drain voltage of the switching element 42 of the DC-DC converter 40A is suppressed as compared with the drain voltage of the switching element 42 of the DC-DC converter 40 as illustrated in FIG. 6A.

As illustrated in FIG. 6B, the power consumption of the resistor 82 increases immediately after the switching element 42 is switched off from on-state, and a resonance of the drain voltage Vd decreases gradually as time goes on.

Accordingly, the snubber circuit 80 which is connected parallel to the switching element 42 suppresses the surge voltage which is generated when the switching element 42 is turned off from the on-state.

However, since the resistor of the snubber circuit 80 consumes the snubber energy (snubber power), the circuit efficiency of the DC-DC converter 40A and the power supply unit 10A is decreased.

Although, the surge voltage of the switching element 42 is suppressed by connecting the snubber circuit 80 parallel to the switching element 42, an energy loss occurs in the DC-DC converter 40A and the power supply unit 10A, since the snubber energy (electrical power) which is absorbed in the capacitor 81 is consumed by the resistor 82 in the snubber circuit 80.

The DC-DC converter, the power supply unit and the information processing apparatus according to the embodiments described below may include a countermeasure technique to prevent such energy loss. In the following, the DC-DC converter, the power supply unit and the information processing apparatus according to the embodiments are described with the accompanying drawings.

[First Embodiment]

Figure 7:
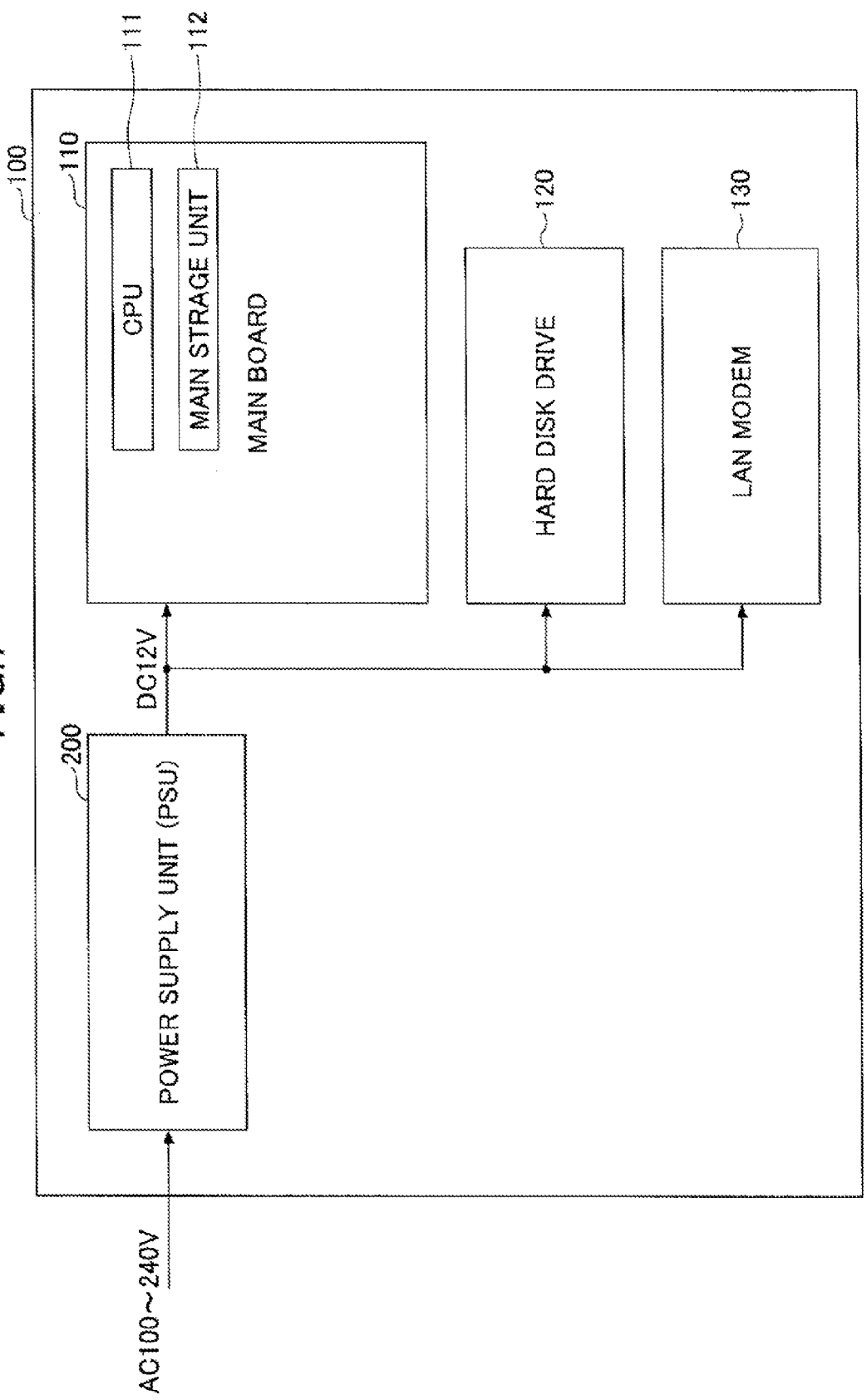
FIG. 7 is a block diagram illustrating an information processing apparatus including a power supply unit according to a first embodiment.

FIG. 7 is a block diagram illustrating an information processing apparatus including a power supply unit 200 according to the first embodiment.

In this embodiment, a server 100 serves as an example of the information processing apparatus.

The server 100 includes a power supply unit (PSU) 200 according to the first embodiment, a main board 110, a hard disk drive 120, and a local area network (LAN) modem 130. FIG. 7 illustrates a configuration of the information processing apparatus (i.e., the server 100) that includes the main board 110, the hard disk drive 120 and the LAN modem 130 for purposes of illustration; however, the server 100 may include components in addition to the main board 110, the hard disk drive 120, and the LAN modem 130.

The main board 110 includes a central processing unit (CPU) 111 and a main storage unit 112 such as a random access memory (RAM) or a read only memory (ROM).

In the server 100, the power supply unit 200 supplies power to the CPU 111 and the main storage unit 112 mounted on the main board 110, the hard disk drive 120 and the LAN modem 130. Alternating current (AC) voltage of 100 V (effective value) is input to the power supply unit 200 from the AC power source 1. The power supply unit 200 converts AC power into direct current (DC) power while reducing the corresponding voltage, and outputs the converted DC power having the voltage of 12 V.

Although, an embodiment in which the power supply unit 200 is included in the server 100 is illustrated in FIG. 7, the power supply unit 200 may be disposed outside of the server 100. In a case where the power supply unit 200 is disposed outside of the server 100, the power supply unit 200 may be an AC adapter.

Next, the power supply unit 200 according to the first embodiment is described with reference to FIG. 8.

Figure 8:
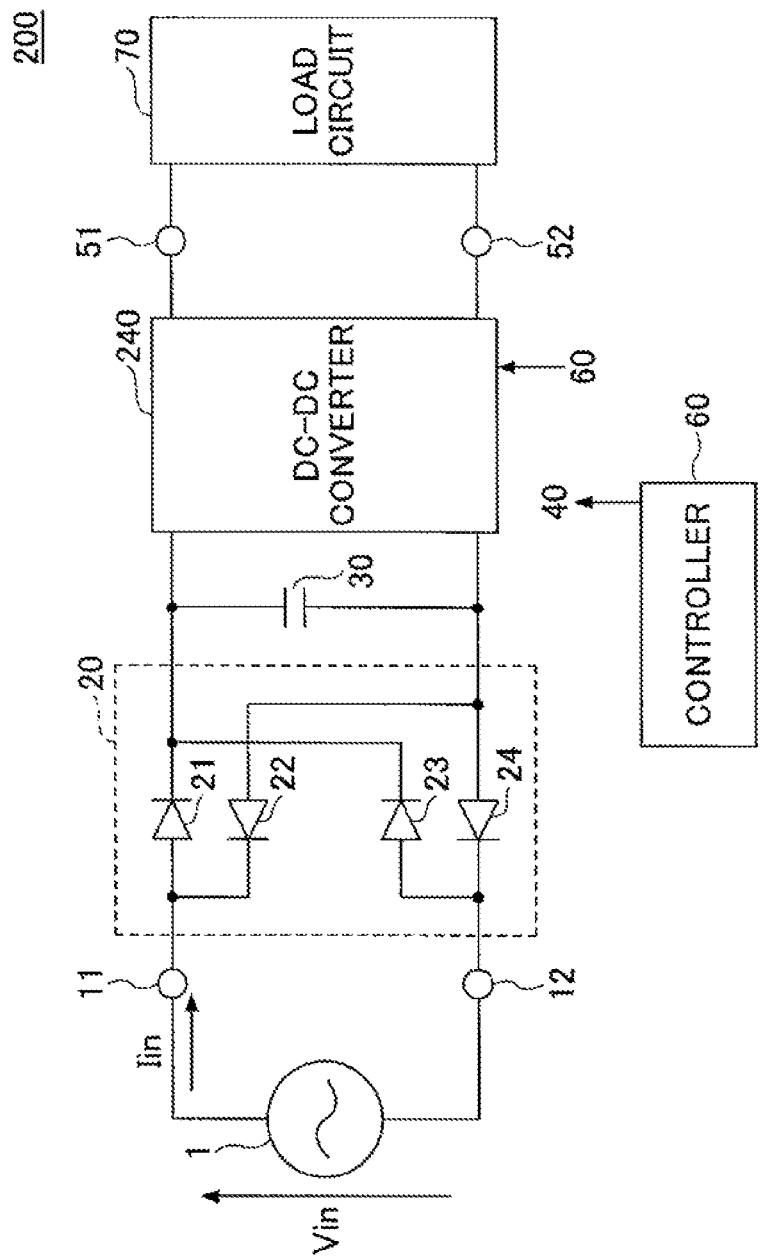
FIG. 8 is a circuit diagram illustrating the power supply unit according to the first embodiment.

FIG. 8 is a circuit diagram illustrating the power supply unit 200 according to the first embodiment. In FIG. 8, the same reference numerals are assigned to components identical to those of the first and the second comparative examples of the power supply units (see FIGS. 1 and 5), and the corresponding descriptions are appropriately omitted.

The power supply unit 200 includes the input terminals 11 and 12, the rectifier circuit 20, the first smoothing capacitor 30, a DC-DC converter 240, the output terminals 51 and 52 and the controller 60.

The input terminals 11 and 12 are one example of a pair of terminals to which the AC power source 1 is connected. AC power is input to the power supply unit 200 from the AC power source 1 via the input terminals 11 and 12.

The output terminal 51 is one example of a positive terminal which outputs DC power. The output terminal 52 is one example of a negative terminal which outputs DC power. The load circuit 70 is connected to the output terminals 51 and 52.

The DC-DC converter 240 constitutes a DC-DC converter of the first embodiment.

Next, the DC-DC converter 240 according to the first embodiment is described with reference to FIGS. 9A and 9B.

Figure 9A:
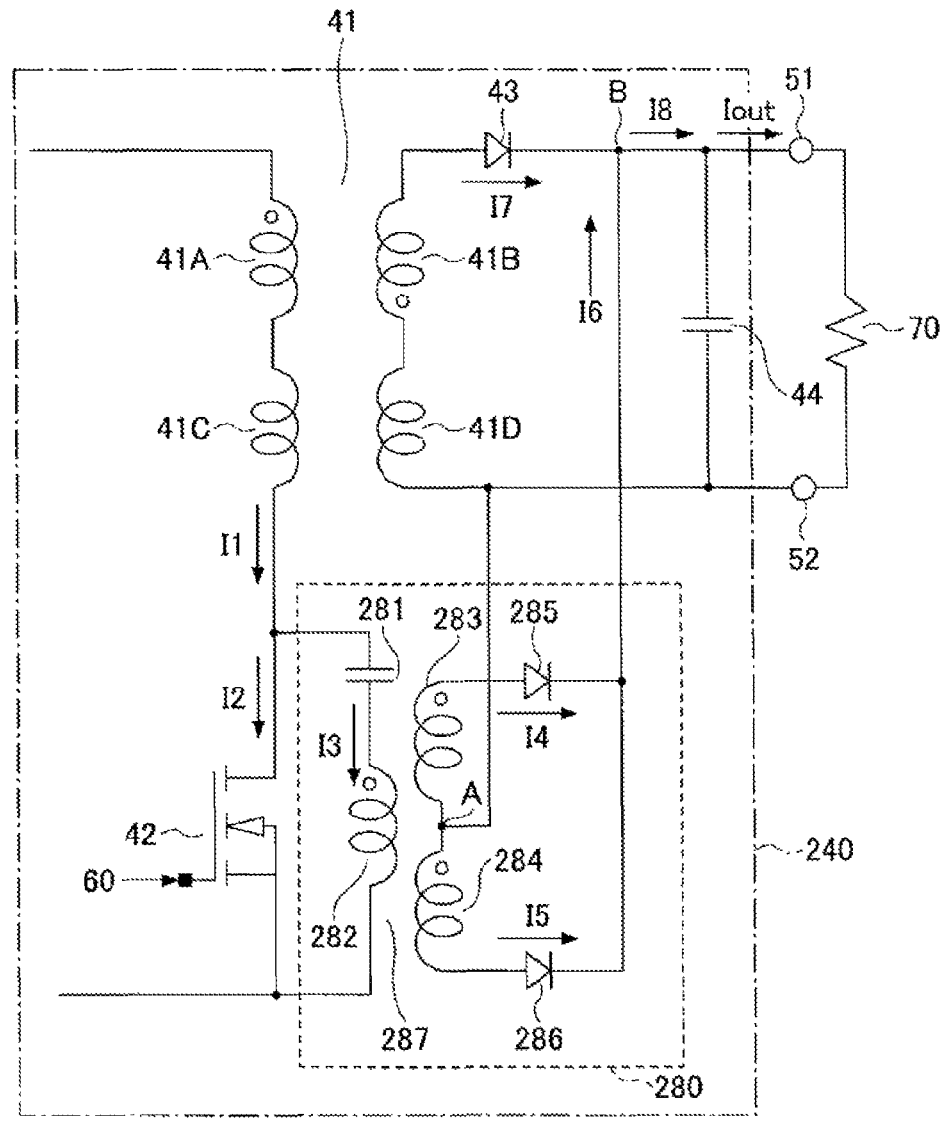
FIG. 9A is a circuit diagram illustrating a DC-DC converter according to the first embodiment.

FIG. 9A is a circuit diagram illustrating the DC-DC converter 240 according to the first embodiment. FIG. 9B is a circuit diagram illustrating a driving circuit of a GaN-HEMT which is utilized as the switching element 42 of the DC-DC converter 240 according to the first embodiment.

The DC-DC converter 240 includes the transformer 41, the switching element 42, the diode 43, the second smoothing capacitor 44 and a snubber circuit 280.

Herein, similar to the first and second comparative examples, the transformer 41 is described as to include the first winding 41A, the second winding 41B, the first leakage inductor 41C and the second leakage inductor 41D.

The load circuit 70 is connected to the DC-DC converter 240 via the output terminals 51 and 52.

According to the first embodiment, the GaN-HEMT (High Electron Mobility Transistor) is utilized as the switching element 42. The HEMT, which is made of GaN (gallium nitride), may exhibit a higher speed operation and a lower on-resistance compared to the silicon MOSFET.

Herein, the transformer 41 is one example of a first transformer, the first winding 41A is one example of a first winding of the first transformer and the second winding 41B is one example of a second winding of the first transformer. The switching element 42 is one example of a switching element which is connected to the first winding of the first transformer. The output terminals 51 and 52 are one example of a pair of output terminals that are connected to the second winding of the first transformer and output the DC power.

The snubber circuit 280 includes a capacitor 281, a first winding 282, a pair of second windings 283 and 284 and diodes 285 and 286.

The capacitor 281 and the first winding 282 are connected in parallel between the drain and the source of the switching element 42.

Both of the second windings 283 and 284 are coupled with the first winding 282. The first winding 282 and the second windings 283 and 284 form a transformer 287. The transformer 287 is one example of a second transformer.

One end of the second winding 283 is connected to an input terminal of the diode 285. One end of the second winding 284 is connected to an input terminal of the diode 286. The other ends of the second windings 283 and 284 are connected with each other at a connecting point A.

Output terminals of the diodes 285 and 286 are connected to the output terminal of the diode 43 at a connecting point B. The connecting point B is connected to a high potential side terminal of the second smoothing capacitor 44 and the output terminal 51. The high potential side terminal is a terminal which is connected to the upper electrode of the second smoothing capacitor 44 as illustrated in FIG. 9A. The connecting point A is connected to a low potential side terminal of the second smoothing capacitor 44 and the output terminal 52. The low potential side terminal is a terminal which is connected to the lower electrode of the second smoothing capacitor 44 as illustrated in FIG. 9A.

Although polar characteristics of the second windings 283 and 284 are equal to each other, the second winding 283 and the second winding 284 are connected to the connecting point A in the opposite direction with each other. Thus, a direction to which an inductive current is output from the second winding 283 and a direction to which an inductive current is output from the second winding 284 are different to each other.

The first winding 282 is one example of a first winding of the second transformer. The second windings 283 and 284 are one example of a pair of second windings of the second transformer.

Hereinafter, for the purpose of describing an operation of the DC-DC converter 240 according to the first embodiment, a current which flows thorough the first winding 41A and the first leakage inductor 41C is referred to as a current I1, a current which flows through the switching element 42 is referred to as a current I2 and a current which flows through the capacitor 281 and the first winding 282 is referred to as a current I3.

A current which flows thorough the second winding 283 and the diode 285 is referred to as a current I4, a current which flows through the second winding 284 and the diode 286 is referred to as a current I5 and a current which flows into the connecting point B from the diodes 285 and 286 is referred to as a current I6. The current I6 is a resultant current of the current I4 and the current I5.

A current which flows through the second winding 41B and the diode 43 is referred to as a current I7 and a current which flows from the connecting point B to the high potential side terminal of the second smoothing capacitor 44 is referred to as a current I8. The current I8 is a resultant current of the current I6 and the current I7.

A current which flows from the high potential side terminal of the second smoothing capacitor 44 to the output terminal 51 is referred to as a current Iout.

Arrows I1 to I8 and Iout illustrated in FIG. 9A indicate positive directions of currents I1 to I8 and Iout, respectively.

When the current I3 flows through the first winding 282 in the positive direction, the current I4 which is proportional to a turns ratio of the first winding 282 and the second winding 283 flows through the second winding 283 in the positive direction. A ratio of the current I3 and the current I4 is equal to the turns ratio of the first winding 282 and the second winding 283. When the current I3 flows through the first winding 282 in the negative direction, i.e. the opposite direction to the positive direction of the current I3, the current I5 which is proportional to a turns ratio of the first winding 282 and the second winding 284 flows through the second winding 284 in the positive direction. A ratio of the current I3 and the current I5 is equal to the turns ratio of the first winding 282 and the second winding 284.

Next, the driving circuit of the GaN-HEMT which is utilized as the switching element 42 of the DC-DC converter 240 according to the first embodiment is described with reference to FIG. 9B.

Figure 9B:
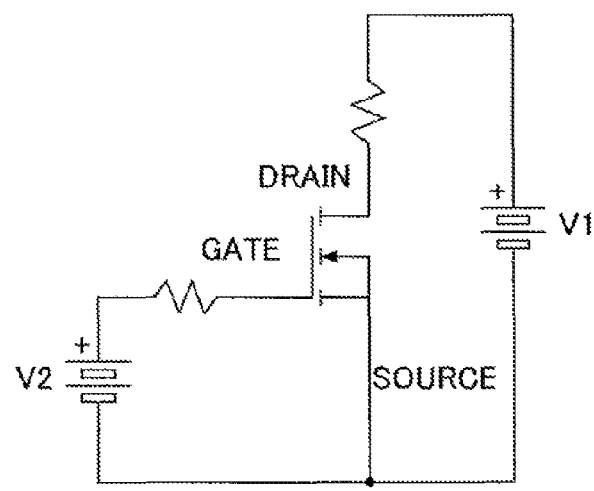
FIG. 9B is a circuit diagram illustrating a driving circuit of a GaN-HEMI which is utilized as a switching element of the DC-DC converter according to the first embodiment.

As illustrated in FIG. 9B, the GaN-HEMT is a three-terminal transistor which includes a drain, a source and a gate. For example, in a condition where the source is grounded and a designated positive voltage V1 is applied between the source and the drain, the GaN-HEMT is turned on, i.e. a conducting channel is created between the source and the drain, when a voltage V2 which is applied between the source and the gate is increased greater than or equal to a threshold voltage.

As described above, the configuration and the operation of the GaN-HEMT are similar to those of the MOSFET.

As illustrated in FIG. 9A, the gate of the GaN-HEMT is connected to the controller 60 (see FIG. 8). The gate voltage of the GaN-HEMT is controlled by the controller 60.

The GaN-HEMT may perform high-speed switching operations of the order of 10 MHz.

Next, the currents I1 to I8 and Iout of the DC-DC converter 240 according to the first embodiment is described with reference to FIG. 10.

FIG. 10 is a graph illustrating the currents I1 to I8 and Iout that flow through the DC-DC converter 240.

As illustrated in FIG. 10, the horizontal axes of the graph indicate time axes, and the vertical axes of the graph indicate current values.

The switching element 42 is turned on at time 0 and is turned off at time t1.

As the switching element 42 is turned on at time 0, the current I1 flowing through the first winding 41A and the first leakage inductor 41C gradually increases, and the current I2 flowing through the switching element 42 gradually increases.

During a period of time in which the switching element 42 is turned on (i.e. from time 0 to time t1), the currents I3 to I8 and Iout are zero, since no current flows through the snubber circuit 280 and the secondary side of the DC-DC converter 240.

As the switching element 42 is turned off at time t1, the current I2 flowing through the switching element 42 instantly becomes zero, and remaining magnetic energy in the first leakage inductor 41C causes the surge current to flow through the first leakage inductor 41C. Thus, the surge current appears in the current I1 at time t1.

Since the surge current flowing through the leakage inductor 41C flows through the capacitor 281 and the second winding 283, the surge current appears in the current I3 after time t1.

The surge current (the current I3) flowing through the first winding 282 is transferred to the second windings 283 and 284 in proportion to the turns ratio of the first winding 282 and the second winding 283 and the turns ratio of the first winding 282 and the second winding 284, respectively. Thus, the positive component of the current I3 is transferred to the secondary side as the current I4, and the negative component of the current I3 is transferred to the secondary side as the current I5. The current I4 and I5 attenuate in accordance with the attenuation of the surge current (the current I3).

Since the current I6 is the resultant current of the currents I4 and I5, a wave form of the current I6 is given as the composite wave form of wave forms of the currents I4 and I5.

As the switching element 42 is turned off at time t1, magnetic energy collected in the second winding 41B is released from the second winding 41B as a current. Thus, the current I7 flows from the second winding 41B to the diode 43 after time t1. The current I7 is generated by the magnetic energy collected in the second winding 41B which is transferred from the first winding 41A to the second winding 41B. Thus, the ratio of the current values of the currents I1 and I7 is proportional to the turns ratio of the first winding 41A and the second winding 41B.

Since the current I8 which flows from the connecting point B to the high potential side terminal of the second smoothing capacitor 44 is the resultant current of the currents I6 and I7, a wave form of the current I8 is given as the composite wave form of wave forms of the currents I6 and I7.

The current I8 is smoothed at the second smoothing capacitor 44.

Since the current Iout which flows from the high potential side terminal of the second smoothing capacity 44 to the output terminal 51 is smoothed at the second smoothing capacitor 44, the current Iout becomes constant as illustrated in FIG. 10.

As described above, the DC-DC converter 240 according to the first embodiment transfers the surge current generated in the primary side to the secondary side by utilizing the first winding 282 and the second windings 283 and 284. Although polar characteristics of the second windings 283 and 284 are equal to each other, the second winding 283 and the second winding 284 are connected to the connecting point A in the opposite direction with each other. Thus, the direction to which the inductive current is output from the second winding 283 and the direction to which the inductive current is output from the second winding 284 are different to each other.

Thus, as illustrated in FIG. 10, the positive component and the negative component of the surge current which flows through the first winding 282 as the current I3 after time t1 are regenerated to the secondary side of the DC-DC converter 240 as the currents I4 and I5.

The DC-DC converter 240 regenerates the positive component and the negative component of the surge current which flows in the primary side of the DC-DC converter 240 to the secondary side by utilizing the transformer 287. Thus, the power loss which may occur during a voltage conversion of the DC-DC converter 240 is reduced.

Next, simulation results of the surge voltage obtained in the DC-DC converter 240 according to the first embodiment and the DC-DC converter 40A (see FIG. 5) according to the second comparative example are described with reference to FIG. 11.

FIG. 11 is a characteristic graph illustrating the simulation results of the surge voltage obtained in the DC-DC converter 240 according to the first embodiment and the DC-DC converter 40A according to the second comparative.

A characteristic represented in the bold line indicates the drain voltage (Vd) of the switching element 42 of the DC-DC converter 240 according to the first embodiment, and a characteristic represented in fine line indicates the drain voltage (Vd) of the switching element 42 of the DC-DC converter 40A according to the second comparative example.

The simulation results as illustrated in FIG. 11 are obtained by utilizing LTspice (simulation program with integrated circuit emphasis) as a circuit simulator. Since the spice performs calculations by taking into account a parasitic capacitance of the switching element 42, the spice provides a simulation result which is close to an actual result.

The simulation result on the DC-DC converter 40A according to the second comparative example is obtained under the corresponding conditions in which the capacitance of the capacitor 81 is 2000 pF and the resistance of the resistor 82 is 82 kΩ. The simulation result on the DC-DC converter 240 according to the embodiment is obtained under the corresponding conditions in which the capacitance of the capacitor 281 is 2000 pF, the inductance of the first winding 282 is 10 μH, the inductance of the second windings 283 and 284 is 2.5

μH, the rated voltage of the diodes 285 and 286 is 200 V and the rated current of the diodes 285 and 286 is 1 A.

Note that these values described above are illustrative only for the purpose of performing the simulations. Thus, the capacitance of the capacitor 281, the inductances of the first winding 281 and the second windings 283 and 284 and the rated voltage and current of the diodes 285 and 286 are not limited to the values described above.

Note that the simulation results as illustrated in FIG. 11 are obtained under the condition in which the AC voltage (effective value) output from the AC power source 1 is 100 V.

As illustrated in FIG. 11, the center voltage of the resonance occurring in the drain voltage of the switching element 42 of the DC-DC converter 240 according to the first embodiment is about 280 V, and the drain voltage rises up to about 360 V. Thus, the maximum amplitude of the surge voltage is about 80 V.

On the contrary, the center voltage of the resonance occurring in the drain voltage of the switching element 42 of the DC-DC converter 40A according to the second comparative example is about 280 V, and the drain voltage rises up to about 570 V. Thus, the maximum amplitude of the surge voltage is about 290 V.

Accordingly, the DC-DC converter 240 according to the first embodiment reduces the surge voltage by a large degree by including the snubber circuit 280 as compared with the DC-DC converter 40A which includes the snubber circuit 80. The snubber circuit 280 according to the first embodiment includes the transformer 287 which regenerates the surge energy generated in the primary side to the secondary side. On the contrary, the snubber circuit 80 according to the second comparative example includes the capacitance 81 and the resistor 82. The snubber circuit 80 is an RC snubber circuit.

Note that the center voltage of about 280 V is obtained under the condition in which the AC voltage (effective value) of the AC power source 1 is 100 V. Since the DC-DC converters 240 and 40A include the flyback type transformer 41, a voltage which is two times as high as the peak voltage of the AC voltage output from the AC power source 1 is applied to the switching element 42. Thus, the center voltage becomes about 280.

Next, a setting of the capacitance of the capacitor 281 of the DC-DC converter 240 is described with reference to FIGS. 12A to 12C.

FIG. 12A is a circuit diagram illustrating the DC-DC converter 240 according to the first embodiment. FIGS. 12B and 12C are circuit diagrams illustrating equivalent circuits of the DC-DC converter 240 according to the first embodiment.

FIG. 12A illustrates the DC-DC converter 240, the output terminals 51 and 52 and the load circuit 70. The circuit as illustrated in FIG. 12A is equal to the circuit as illustrated in FIG. 9A.

Among the components as illustrated in FIG. 12A, the diode 43, the second winding 41B, the second leakage inductor 41D, and the diodes 285 and 286 have little or no influence on the capacitance of the capacitor 281.

Since the first leakage inductor 41C is divided from the first winding 41A, the first winding 41A is considered to have little or no influence on the capacitance of the capacitor 281.

In the circuit as illustrated in FIG. 12A, the magnetic energy collected in the first leakage inductor 41C is released from the first leakage inductor 41C as the snubber energy when the switching element 42 is turned off from the on-state. The snubber energy generates the snubber current flowing through the capacitor 281 and the first winding 282.

Thus, the switching element 42 is treated equivalently as a switch that is turned on when the switching element 42 is turned off.

Accordingly, the switching element 42 as illustrated in FIG. 12A is converted into the switch 42A as illustrated in FIG. 12B.

An equivalent circuit as illustrated in FIG. 12B includes a series circuit 240A and a parallel circuit 240B. The series circuit 240A includes the switch 42A, the first leakage inductor 41C, the capacitor 281, the first winding 282 and a power source that outputs the DC voltage Vin. The parallel circuit 240B includes the second winding 283, the second smoothing capacitor 44 and the load circuit 70. The first winding 282 and the second winding 283 are coupled with each other, and are equivalent to the transformer 287.

The drain voltage Vd of the switching element 42 as illustrated in FIG. 12A is equal to a voltage between both ends of the capacitor 281 and the first winding 282. The switch 42A as illustrated in FIG. 12B is turned on when the switching element 42 as illustrated in FIG. 12A is turned off. Thus, in FIG. 12B, the drain voltage Vd is illustrated as the voltage between both ends of the capacitor 281 and the first winding 282.

Since the diodes 285 and 286 (see FIG. 12A) are omitted in the parallel circuit 240B as illustrated in FIG. 12B, a current flows in both directions in the parallel circuit 240B. Thus, the second winding 284 (see FIG. 12A) is omitted in the parallel circuit 240B as illustrated in FIG. 12B. The second winding 283 as illustrated in FIG. 12B is equal to the second winding 283 as illustrated in FIG. 12A. Hereinafter, the turns ratio of the first winding 282 and the second winding 283 is described as to N:1. Herein, N is an arbitrary integer number.

Next, an equivalent circuit as illustrated in FIG. 12C is obtained by omitting the first winding 282 and the second winding 283 as illustrated in FIG. 12B.

The equivalent circuit as illustrated in FIG. 12C has a circuit configuration which is obtained by inserting a parallel circuit which includes a resistor 70A and a capacitor 44A into a series circuit which includes the switch 42A, the first leakage inductor 41C, the capacitor 281 and the power source. The circuit as illustrated in FIG. 12C is obtained by omitting the first winding 282 and the second winding 283 that form the transformer 287 as illustrated in FIG. 12B.

The resistor 70A is equivalent to the load circuit 70 as illustrated in FIG. 12B. The resistance of the resistor is described as to R×N$^2$ where R is the resistance of the load circuit 70.

The capacitor 44A is equivalent to the capacitor 44 as illustrated in FIG. 12B. The capacitance of the capacitor 44A is described as C/N$^2$ where the capacitance of the capacitor 44 is C.

As illustrated in FIG. 12C, the drain voltage Vd is applied to the capacitor 281 and the parallel circuit of the resistor 70A and the capacitor 44A.

Since an effect that the capacitor 44A has on the surge current is much smaller than that of the resistor 70A, the capacitor 44A is omitted when considering a current flowing through the circuit as illustrated in FIG. 12C. Thus, a current I which flows into a series circuit of the switch 42A, the first leakage inductor 41C, the capacitor 281, the resistor 70A and the power source (Vin) is described by a formula (1).

$$I = \frac{Vin}{\beta \cdot L} e^{-\alpha t} \sinh(\beta t) \qquad (1)$$

Herein, α is $(RN^2)/(2L)$, and L is the inductance of the first leakage inductor 41C. β is a value which is obtained by a formula (2). Cs is the capacitance of the capacitor 281.

$$\beta = \frac{\sqrt{(RN^2)-(4L/Cs)}}{2L} \quad (2)$$

Since the drain voltage Vd is applied between both ends of the capacitor 281 and the resistor 70A, the drain voltage Vd is described by a formula (3).

$$Vd = \frac{Vin}{\beta \cdot L}\left\{\frac{1}{Cs}\int_0^\tau e^{-\alpha t}\sinh(\beta \cdot t)dt + RN^2 \cdot e^{-\alpha t}\sinh(\beta \cdot t)\right\} \quad (3)$$

As described in the formula (3), the drain voltage Vd is expressed as a function of the capacitance Cs of the capacitor 281. β which is included in the formula (3) is obtained by the formula (2).

Thus, the capacitance Cs of the capacitor 281 may be set to a capacitance so that the drain voltage Vd becomes sufficient voltage for protecting the switching element 42 from the surge voltage, when designing the DC-DC converter 240.

In a case where the capacitance Cs is set to a capacitance which causes the drain voltage Vd to be decreased, the switching element 42 is realized by the GaN-HEMT which has a lower withstand voltage. The GaN-HEMT which has the lower withstand voltage has a low on resistance and is cheap. The power loss of the DC-DC converter 240 is reduced and the cost thereof is lowered by designing the capacitance Cs which causes the drain voltage Vd to be decreased.

Next, a resonance condition of the capacitor 281 and the first winding 282 is described.

The resonance occurring in the DC-DC converter 240 is converged efficiently by converging the resonance which occurs in the capacitor 281 and the first winding 282. In order to converge the resonance which occurs in the capacitor 281 and the first winding 282, the turns ratio of the first winding 282 and the second winding 283 may satisfy a formula (4). The turns ratio of the first winding 282 and the second winding 283 is described as to N:1.

$$RN^2 - \frac{4L}{Cs} > 0 \quad (4)$$

Thus, the turns ratio of the first winding 282 and the second windings 283 and 284 may be set to a value which satisfies the formula (4). Herein, the second windings 283 and 284 have the same coil turns.

The surge energy is regenerated effectively from the primary side to the secondary side by setting the turns ratio of the first winding 282 and the second windings 283 and 284 to the value which satisfies the formula (4). The surge energy is transferred from the primary side to the secondary side of the DC-DC converter 240 and is supplied to the load circuit 70.

Since the transformer 287 of the DC-DC converter 240 according to the first embodiment transforms both the positive component and the negative component of the surge current to the secondary side, the power loss during the voltage conversion is reduced.

The power loss and the cost of the DC-DC converter 240 is reduced by setting the capacitance Cs of the capacitor 281 to the capacitance which causes the drain voltage Vd to be decreased.

Further, the surge energy is efficiently regenerated to the secondary side of the DC-DC converter 240 by setting the turns ratio of the first winding 282 and the second windings 283 and 284.

The second windings 283 and 284 included in the transformer 287 may be saturable inductors (saturable reactors). In this case, if the saturable current of the saturable inductors is set to be less than or equal to the maximum current of the current Iout which flows through the output terminal 51, the saturable inductors saturate when a current which excess the maximum value of the current Iout. Thus, an anomalous increase of the current Iout is suppressed.

[Second Embodiment]

A DC-DC converter according to a second embodiment is different from the DC-DC converter 240 of the first embodiment in that the switching element 42, the capacitor 281, the first winding 282, the second windings 283 and 284 and the diodes 285 and 286 are modularized on the same substrate by bare chip mounting. Otherwise, the power supply unit according to the second embodiment is the same as the power supply unit 200 of the first embodiment. Accordingly, the same elements as or elements similar to those of the power supply unit 200 of the first embodiment are referred to by the same reference numerals, and a description thereof is omitted.

Figure 13A:
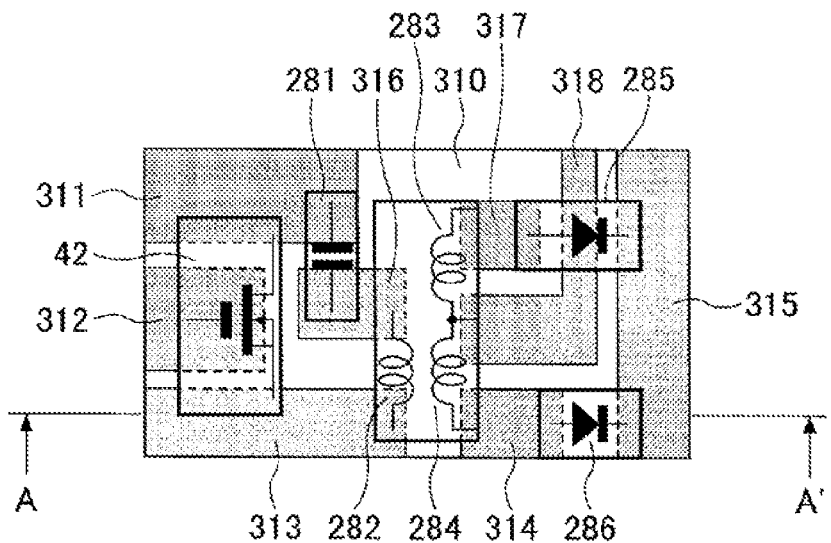
FIG. 13A is a diagram illustrating a plan view of a mounting configuration of the switching element, the capacitor, the first winding, the second windings and diodes.
Figure 13B:
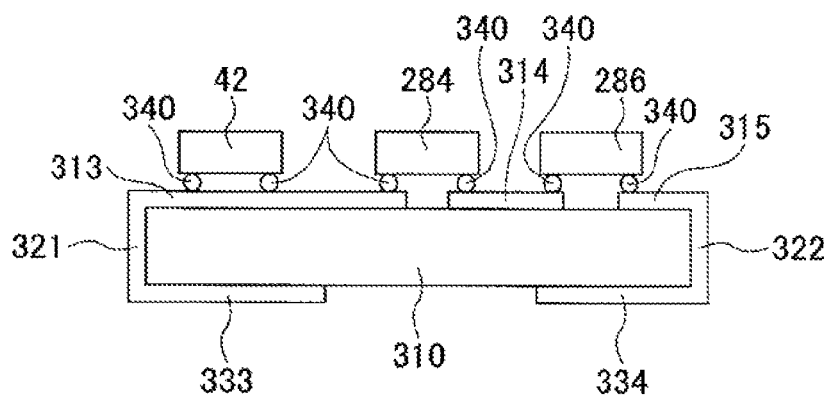
FIG. 13B is a diagram illustrating a cross-sectional view of the mounting configuration of the switching element, the capacitor, the first winding, the second windings and the diodes.
Figure 13C:
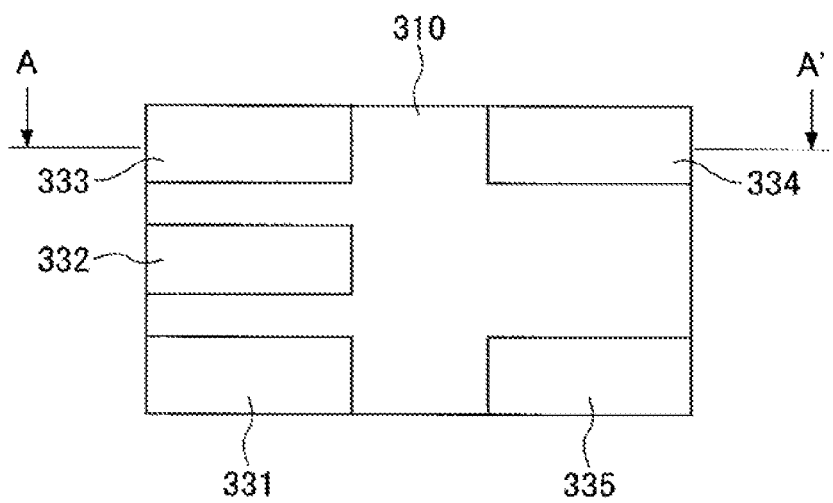
FIG. 13C is a diagram illustrating a bottom view of the mounting configuration of the switching element, the capacitor, the first winding, the second windings and the diodes.

FIGS. 13A through 13C are diagrams illustrating mounting configurations of the switching element 42, the capacitor 281, the first winding 282, the second windings 283 and 284 and the diodes 285 and 286. FIGS. 13A, 13B, and 13C are a plan view, a cross-sectional view taken along the line A-A' of FIG. 13A, and a bottom view, respectively, of part of the power supply unit according to the second embodiment. FIG. 13B illustrates a cross section viewed in the direction of arrows A and A' in FIG. 13A.

For a substrate 310 illustrated in FIGS. 13A through 13C, for example, a glass epoxy substrate of an FR-4 (Flame Retardant Type 4) base material to which copper foil is formed may be used.

As illustrated in FIG. 13A, the substrate 310 includes copper foil patterns 311, 312, 313, 314, 315, 316, 317 and 318 on its top surface.

In FIG. 13A, the copper foil patterns 311 to 318 are illustrated with dotted patterns, and the switching element 42, the capacitor 281, the first winding 282, the second windings 283 and 284 and the diodes 285 and 286 are illustrated with bold lines.

The switching element 42, the capacitor 281, the first winding 282, the second windings 283 and 284 and the diodes 285 and 286 are mounted onto the copper foil patterns 311, 312, 313, 314, 315, 316, 317 and 318 by, for example, bumps 340 (see FIG. 13B), respectively. For the bumps 340, gold-ball bumps may be used.

According to the second embodiment, the switching element 42, the capacitor 281, the first winding 282, the second windings 283 and 284 and the diodes 285 and 286 are modularized on the same substrate by bare chip mounting as described above.

In FIG. 13A, interconnections that interconnect the switching element 42, the capacitor 281, the first winding 282, the second windings 283 and 284 and the diodes 285 and 286 are omitted. The switching element 42, the capacitor 281, the first winding 282, the second windings 283 and 284 and the diodes 285 and 286 may be interconnected, for example, by flip-chip bonding or with bonding wires as illustrated in FIG. 9A.

As illustrated in FIG. 13C, the substrate 310 has copper foil patterns 331, 332, 333, 334 and 335 on its bottom surface as well. The copper foil patterns 331, 332, 333, 334 and 335 may be used as, for example, electrodes for connecting the switching element 42, the capacitor 281, the first winding 282, the second windings 283 and 284 and the diodes 285 and 286 to circuit elements around the power supply unit according to the second embodiment.

The copper foil patterns 311, 312, 313, 314, 315, 316, 317 and 318 on the top side illustrated in FIG. 13A and the copper foil patterns 331, 332, 333, 334 and 335 on the bottom side illustrated in FIG. 13C may be connected using copper foil patterns 321 and 322 formed on side surfaces of the substrate 310 as illustrated in FIG. 13B.

Further, the copper foil patterns 311, 312, 313, 314, 315, 316, 317 and 318 on the top side illustrated in FIG. 13A and the copper foil patterns 331, 332, 333, 334 and 335 on the bottom side illustrated in FIG. 13C may also be connected using vias.

Thus, according to the DC-DC converter of the second embodiment, the switching element 42, the capacitor 281, the first winding 282, the second windings 283 and 284 and the diodes 285 and 286 are modularized. The modularization allows connecting parts for connecting switching element 42, the capacitor 281, the first winding 282, the second windings 283 and 284 and the diodes 285 and 286 to the copper foil patterns 311 through 318 to be equal in length using the bumps 340. Accordingly, it is possible to reduce parasitic inductance at the connecting parts (bumps 340).

Further, if it is possible to reduce parasitic inductance by modularizing the switching element 42, the capacitor 281, the first winding 282, the second windings 283 and 284 and the diodes 285 and 286, it is possible to reduce the capacitance of the capacitor 281 and the inductance of the first winding 282 and the second windings 283 and 284. This makes it possible to further reduce the size of the power supply unit according to the second embodiment.

The thickness of the copper foil patterns 311 through 318 and 331 through 335 may be determined in view of the skin effect as follows.

A thickness d that generates the skin effect may be determined by a formula (5).

$$d = \{2/(\omega \times \mu \times \rho)\}^{1/2} \quad (5)$$

where $\omega$ is an angular frequency, $\mu$ is the magnetic permeability of a conductor (copper), and $\rho$ is the electrical conductivity of a conductor (copper).

For example, in the case of switching the switching element 42 at 10 MHz, if $\omega = 2\pi \times 10 \times 10^6$ (rad/s), $\mu = \mu_0 \times 0.999991$, and $\rho = 5.76 \times 10^7$ (S/m), d is determined as d≈21 μm. Here, $\mu_0$ is the magnetic permeability of a vacuum, which is $4\pi \times 10^{-7}$.

Accordingly, for example, in the case of switching the switching element 42 at 10 MHz, it is possible to reduce the resistance of the copper foil patterns 311 through 318 and 331 through 335 by causing the thickness of the copper foil patterns 311 through 318 and 331 through 335 to be more than or equal to 21 μm.

Reduction in the resistance of the copper foil patterns 311 through 318 and 331 through 335 makes it possible to reduce the resistances between the switching element 42, the capacitor 281, the first winding 282, the second windings 283 and 284 and the diodes 285 and 286, so that it is possible to reduce power loss between the switching element 42, the capacitor 281, the first winding 282, the second windings 283 and 284 and the diodes 285 and 286 at the time of switching the switching element 42.

Further, in the power supply unit according to the second embodiment, the equivalent series inductance $L_{ESL}$ of the switching element 42, the capacitor 281, the first winding 282, the second windings 283 and 284 and the diodes 285 and 286 may be determined in the following manner.

The equivalent series inductance $L_{ESL}$ of the switching element 42, the capacitor 281, the first winding 282, the second windings 283 and 284 and the diodes 285 and 286 is expressed by a formula (6).

$$L_{ESL} = V\text{inp}^2 / (P\text{out} \times f_{sw}) \quad (6)$$

where Vinp is the peak value of the input voltage of the rectifier circuit 20, Pout is an output from the output terminals 51 and 52, and fsw is the switching frequency of the switching element 42.

By way of example, the equivalent series inductance $L_{ESL}$ in the case of using a GaN-HEMT as the switching element 42 is determined.

It is assumed that the input voltage Vin of the rectifier circuit 20 is 100 V, the output power Pout of the output terminals 51 and 52 is 1 kW, and the switching frequency fsw of the switching element 42 is 10 MHz.

Since the input voltage Vin of the rectifier circuit 20 is 100 V and the output power Pout of the output terminals 51 and 52 is 1 kW, the peak value of the electric current of the switching element 42 is 14.4 A, and the peak value of the voltage of the switching element 42 is 144 V.

At this time, it is desired to sufficiently reduce the equivalent series inductance $L_{ESL}$ to allow an electric current of up to 14.4 A to flow from the switching element 42, the capacitor 281, the first winding 282, the second windings 283 and 284 and the diodes 285 and 286.

The value of the equivalent series inductance $L_{ESL}$ is determined in the following manner using formula (6).

That is, $L_{ESL} = (144V)^2 / (144V \times 14.4A \times 10 \text{ MHz}) = 1 \mu H$.

By determining the equivalent series inductance $L_{ESL}$ as described above (for example, $L_{ESL}$ is 1 μH or less), it is possible to reduce the effect of parasitic components in the high-speed switching of the order of 10 MHz achieved by using a GaN-HEMT as the switching element 42.

According to the second embodiment, as described above, it becomes possible to further reduce the power loss which may occur when the transformer 287 transforms the positive component and the negative component of the surge current to the secondary side.

[Third Embodiment]

Figure 14:
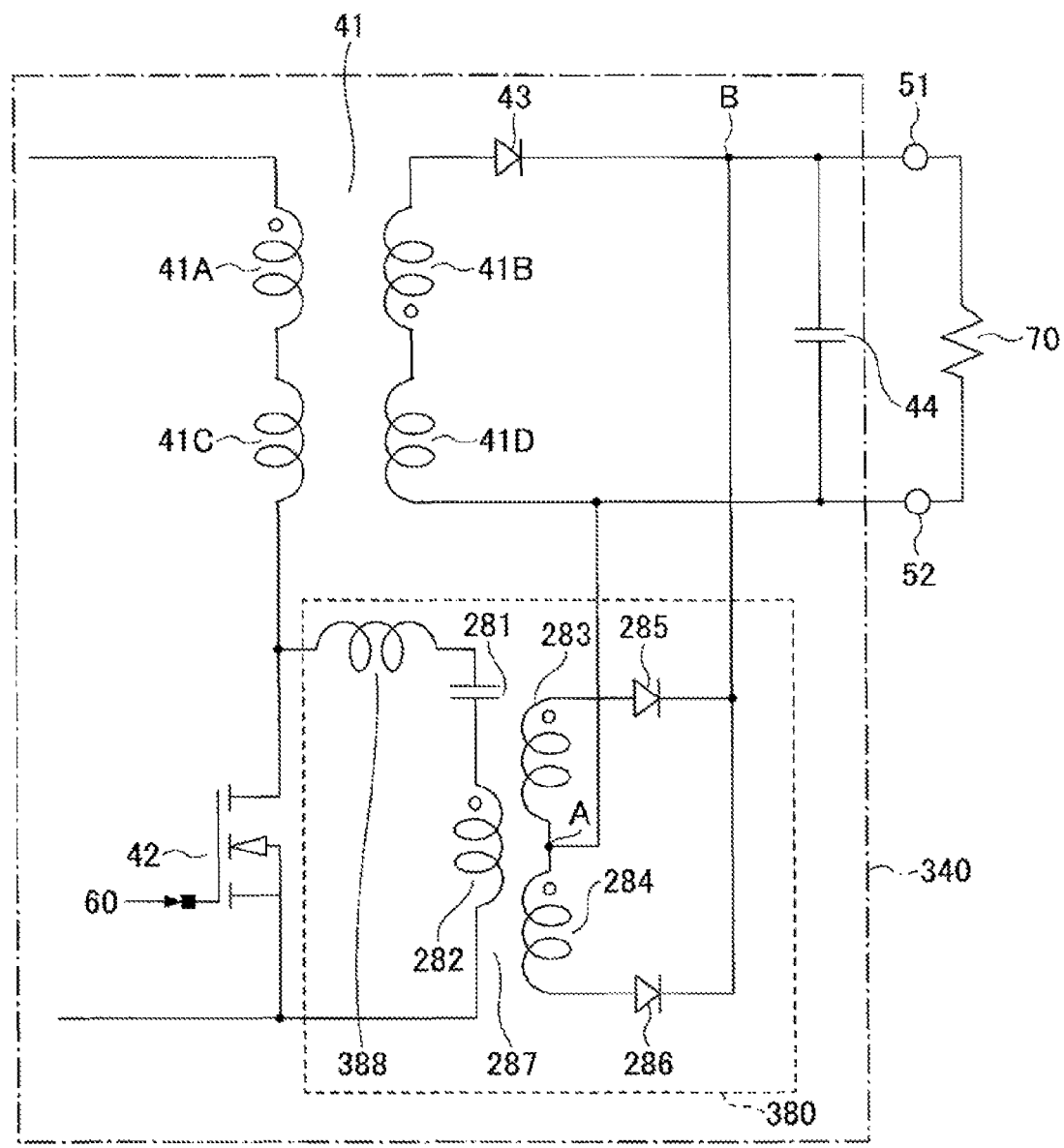
FIG. 14 is a circuit diagram illustrating a DC-DC converter according to a third embodiment.

FIG. 14 is a circuit diagram illustrating a DC-DC converter 340 according to the third embodiment.

A power supply unit 300 according to the third embodiment is different from the power supply unit 200 according to the first embodiment in that the power supply unit 300 includes the DC-DC converter 340. The DC-DC-converter 340 of the third embodiment is different from the DC-DC converter 240 in that the DC-DC converter 340 includes a snubber circuit 380. In the snubber circuit 380, an inductor 388 is inserted in series with the capacitor 281 and the first winding 282.

Otherwise, the power supply unit 300 according to the third embodiment is the same as the power supply unit 200 of the first embodiment. Accordingly, the same elements as or elements similar to those of the power supply unit 200 of the first embodiment are referred to by the same reference numerals, and a description thereof is omitted.

In a case where the inductance of the leakage inductor 41C is relatively small, the resonance energy of the capacitor 281 and the first winding 282 becomes small. In this case, it may be more efficient to enhance the resonance energy in order to regenerate the surge energy generated in the primary side to the secondary side more efficiently.

Since the DC-DC converter 340 of the third embodiment includes the inductor 388 connected in series with the capacitor 281 and the first winding 282, it becomes possible to enhance the resonance energy in the primary side when the transformer 287 regenerate the surge energy generated in the primary side to the secondary side.

Thus, according to the third embodiment, it becomes possible to regenerate the surge energy generated in the primary side to the secondary side more efficiently by adding the inductor 388, in a case where the resonance energy in the primary side is relatively small. Thus, it becomes possible to enhance a transmitting efficiency of the DC-DC converter 340.

[Fourth Embodiment]

Figure 15:
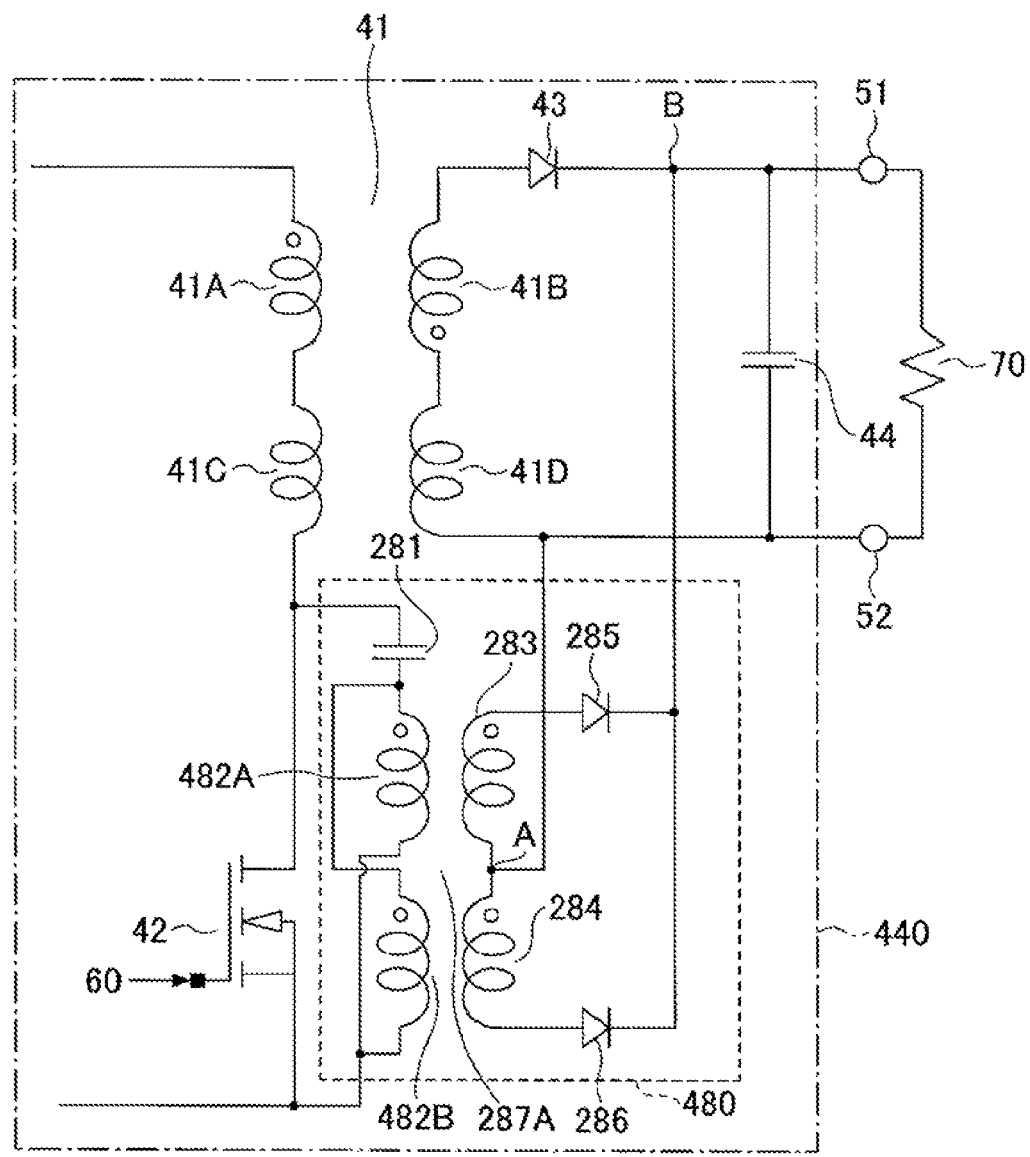
FIG. 15 is a circuit diagram illustrating a DC-DC converter according to a fourth embodiment.

FIG. 15 is a circuit diagram illustrating a DC-DC converter 440 according to the fourth embodiment.

A power supply unit 400 according to the fourth embodiment is different from the power supply unit 200 according to the first embodiment in that the power supply unit 400 includes the DC-DC converter 440. The DC-DC-converter 440 of the fourth embodiment is different from the DC-DC converter 240 in that the DC-DC converter 440 includes a snubber circuit 480. The snubber circuit 480 includes a pair of first windings 482A and 482B instead of the first winding 282 of the snubber circuit 280.

Otherwise, the power supply unit 400 according to the fourth embodiment is the same as the power supply unit 200 of the first embodiment. Accordingly, the same elements as or elements similar to those of the power supply unit 200 of the first embodiment are referred to by the same reference numerals, and a description thereof is omitted.

The DC-DC converter 440 includes the first windings 482A and 482B that are connected in parallel with each other. The first windings 482A and 482B are connected in series with the capacitor 281. The first windings 482A and 482B are coupled with the second windings 283 and 284, respectively. The first windings 482A and 482B and the second windings 283 and 284 constitute a transformer 287A which is one example of a second transformer.

Since the primary side of the transformer 287A is divided into the first windings 482A and 482B, a current flowing through the first winding 482A and a current flowing through the first winding 482B become one-half of the current flowing through the first winding 282 of the first embodiment, respectively.

Thus, the power loss between the first winding 482A and the second winding 283 becomes one-half of the power loss between the first winding 282 and the second winding 283 of the first embodiment. The power loss between the first winding 482B and the second winding 284 becomes one-half of the power loss between the first winding 282 and the second winding 284 of the first embodiment Thus, the power loss of the transformer 287A of the fourth embodiment becomes one-half of the transformer 287 of the first embodiment.

So far, the preferred embodiments and modification of the DC-DC converter, the power supply unit and the information processing apparatus are described. However, the invention is not limited to those specifically described embodiments and the modification thereof, and various modifications and alteration may be made within the scope of the inventions described in the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention.

Although the embodiments of the present invention have been described in detail, it should be understood that the various changes, substitutions, and alterations could be made hereto without departing from the spirit and scope of the invention.

What is claimed is:

1. A DC-DC converter comprising:
a primary winding of a first transformer to which a direct current power is supplied;
a switching element configured to be connected in series with the primary winding of the first transformer;
a primary winding of a second transformer and a capacitor configured to be connected in series with each other, wherein the primary winding of the second transformer and the capacitor are connected in parallel with the switching element;
a secondary winding of the first transformer configured to be coupled with the primary winding of the first transformer;
a pair of output terminals configured to be connected to the secondary winding of the first transformer and to output a direct current power; and
a pair of secondary windings of the second transformer configured to be coupled with the primary winding of the second transformer, the secondary windings of the second transformer being connected in parallel with each other to give reverse polarities between the output terminals,
wherein the capacitor has a capacitance satisfying a condition as described in formulae (1) and (2):

$$Vd = \frac{Vin}{\beta \cdot L} \left\{ \frac{1}{Cs} \int_0^t e^{-\alpha t} \sinh(\beta \cdot t) dt + RN^2 \cdot e^{-\alpha t} \sinh(\beta \cdot t) \right\} \quad (1)$$

$$\beta = \frac{\sqrt{(RN^2)^2 - (4L/Cs)}}{2L} \quad (2)$$

where Vd is a voltage between a power input terminal and a power output terminal of the switching element, Vin is a voltage of the direct current power input to the DC-DC converter, R is a resistance of a load circuit connected to the pair of the output terminals, Cs is a capacitance of the capacitor, N is a turns ratio of the primary winding of the second transformer with regard to the secondary winding of the second transformer, and L is a leakage inductance of the first transformer.

2. The DC-DC converter as claimed in claim 1, further comprising:
an inductor configured to be connected in series with the capacitor and the primary winding of the second transformer,
wherein the inductor, the capacitor and the primary winding of the second transformer are connected in parallel with the switching element.

3. The DC-DC converter as claimed in claim 1,
wherein the switching element is a GaN-HEMT, and
wherein the GaN-HEMT, the capacitor, the primary winding of the second transformer and the secondary windings of the second transformer are modularized onto a same substrate by bare chip mounting.

4. The DC-DC converter as claimed in claim 1,
wherein the primary winding of the second transformer and the secondary windings of the second transformer are saturable inductors.

5. A DC-DC converter comprising:
a primary winding of a first transformer to which a direct current power is supplied;
a switching element configured to be connected in series with the primary winding of the first transformer;
a primary winding of a second transformer and a capacitor configured to be connected in series with each other, wherein the primary winding of the second transformer and the capacitor are connected in parallel with the switching element;
a secondary winding of the first transformer configured to be coupled with the primary winding of the first transformer;
a pair of output terminals configured to be connected to the secondary winding of the first transformer and to output a direct current power; and
a pair of secondary windings of the second transformer configured to be coupled with the primary winding of the second transformer, the secondary windings of the second transformer being connected in parallel with each other to give reverse polarities between the output terminals,
wherein a turns ratio N of the primary winding of the second transformer with regard to the secondary winding of the second transformer satisfies a condition as described in formula (3):

$$RN^2 - \frac{4L}{Cs} > 0 \qquad (3)$$

where Cs is a capacitance of the capacitor and L is a leakage inductance of the first transformer.

6. The DC-DC converter as claimed in claim 5, further comprising:
an inductor configured to be connected in series with the capacitor and the primary winding of the second transformer,
wherein the inductor, the capacitor and the primary winding of the second transformer are connected in parallel with the switching element.

7. The DC-DC converter as claimed in claim 5,
wherein the switching element is a GaN-HEMT, and
wherein the GaN-HEMT, the capacitor, the primary winding of the second transformer and the secondary windings of the second transformer are modularized onto a same substrate by bare chip mounting.

8. The DC-DC converter as claimed in claim 5,
wherein the primary winding of the second transformer and the secondary windings of the second transformer are saturable inductors.

9. A DC-DC converter comprising:
a primary winding of a first transformer to which a direct current power is supplied;
a switching element configured to be connected in series with the primary winding of the first transformer;
a primary winding of a second transformer and a capacitor configured to be connected in series with each other, wherein the primary winding of the second transformer and the capacitor are connected in parallel with the switching element;
a secondary winding of the first transformer configured to be coupled with the primary winding of the first transformer;
a pair of output terminals configured to be connected to the secondary winding of the first transformer and to output a direct current power; and
a pair of secondary windings of the second transformer configured to be coupled with the primary winding of the second transformer, the secondary windings of the second transformer being connected in parallel with each other to give reverse polarities between the output terminals,
wherein the primary winding of the second transformer includes a pair of primary windings that are connected in parallel with each other and are coupled with the secondary windings of the second transformer, respectively.

10. The DC-DC converter as claimed in claim 9, further comprising:
an inductor configured to be connected in series with the capacitor and the primary winding of the second transformer,
wherein the inductor, the capacitor and the primary winding of the second transformer are connected in parallel with the switching element.

11. The DC-DC converter as claimed in claim 9,
wherein the switching element is a GaN-HEMT, and
wherein the GaN-HEMT, the capacitor, the primary winding of the second transformer and the secondary windings of the second transformer are modularized onto a same substrate by bare chip mounting.

12. The DC-DC converter as claimed in claim 9,
wherein the primary winding of the second transformer and the secondary windings of the second transformer are saturable inductors.

* * * * *